United States Patent
Kewley

(10) Patent No.: US 7,488,685 B2
(45) Date of Patent: Feb. 10, 2009

(54) PROCESS FOR IMPROVING CRITICAL DIMENSION UNIFORMITY OF INTEGRATED CIRCUIT ARRAYS

(75) Inventor: David Kewley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 207 days.

(21) Appl. No.: 11/411,401

(22) Filed: Apr. 25, 2006

(65) Prior Publication Data

US 2007/0249170 A1    Oct. 25, 2007

(51) Int. Cl.
H01L 21/302 (2006.01)

(52) U.S. Cl. .................................. 438/689; 216/72

(58) Field of Classification Search ................ 438/689
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhattascharyya et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,268,330 A * | 12/1993 | Givens et al. | 438/586 |
| 5,328,810 A * | 7/1994 | Lowrey et al. | 430/313 |
| 5,330,879 A | 7/1994 | Dennison | |
| 5,470,661 A | 11/1995 | Bailey et al. | |
| 5,514,885 A | 5/1996 | Myrick | |
| 5,670,794 A | 9/1997 | Manning | |

(Continued)

FOREIGN PATENT DOCUMENTS

DE     42 36 609 A1    5/1994

(Continued)

OTHER PUBLICATIONS

U.S. Appl. No. 11/543,515; filed Oct. 24, 2006.

(Continued)

*Primary Examiner*—Keith D. Hendricks
*Assistant Examiner*—Patricia A. George
(74) *Attorney, Agent, or Firm*—Knobbe Martens Olson & Bear LLP

(57) ABSTRACT

Methods for patterning integrated circuit (IC) device arrays employing an additional mask process for improving center-to-edge CD uniformity are disclosed. In one embodiment, a repeating pattern of features is formed in a masking layer over a first region of a substrate. Then, a blocking mask is applied over the features in the masking layer. The blocking mask is configured to differentiate array regions of the first region from peripheral regions of the first region. Subsequently, the pattern of features in the array regions is transferred into the substrate. In the embodiment, an etchant can be uniformly introduced to the masking layer because there is no distinction of center/edge in the masking layer. Thus, CD uniformity can be achieved in arrays which are later defined.

25 Claims, 24 Drawing Sheets

U.S. PATENT DOCUMENTS

| | | | |
|---|---|---|---|
| 5,753,546 | A | 5/1998 | Koh et al. |
| 5,789,320 | A | 8/1998 | Andricacos et al. |
| 5,795,830 | A | 8/1998 | Cronin et al. |
| 5,899,746 | A | 5/1999 | Mukai |
| 5,998,256 | A | 12/1999 | Juengling |
| 6,004,862 | A | 12/1999 | Kim et al. |
| 6,010,946 | A | 1/2000 | Hisamune et al. |
| 6,042,998 | A | 3/2000 | Brueck et al. |
| 6,057,573 | A | 5/2000 | Kirsch et al. |
| 6,063,688 | A | 5/2000 | Doyle et al. |
| 6,071,789 | A | 6/2000 | Yang et al. |
| 6,110,837 | A | 8/2000 | Linliu et al. |
| 6,124,212 | A | 9/2000 | Fan et al. |
| 6,150,678 | A | 11/2000 | Tung et al. |
| 6,204,168 | B1 * | 3/2001 | Naik et al. .................. 438/638 |
| 6,211,044 | B1 | 4/2001 | Xiang et al. |
| 6,288,454 | B1 | 9/2001 | Allman et al. |
| 6,291,334 | B1 | 9/2001 | Somekh |
| 6,297,554 | B1 | 10/2001 | Lin |
| 6,335,257 | B1 | 1/2002 | Tseng |
| 6,348,380 | B1 | 2/2002 | Weimer et al. |
| 6,362,057 | B1 | 3/2002 | Taylor, Jr. et al. |
| 6,383,907 | B1 | 5/2002 | Hasegawa et al. |
| 6,395,613 | B1 | 5/2002 | Juengling |
| 6,423,474 | B1 | 7/2002 | Holscher |
| 6,455,372 | B1 | 9/2002 | Weimer |
| 6,475,684 | B2 | 11/2002 | Ki |
| 6,514,884 | B2 | 2/2003 | Maeda |
| 6,522,584 | B1 | 2/2003 | Chen et al. |
| 6,534,243 | B1 | 3/2003 | Templeton |
| 6,548,396 | B2 | 4/2003 | Naik et al. |
| 6,559,017 | B1 | 5/2003 | Brown et al. |
| 6,566,280 | B1 | 5/2003 | Meagley et al. |
| 6,573,030 | B1 | 6/2003 | Fairbairn et al. |
| 6,602,642 | B2 | 8/2003 | Liu et al. |
| 6,602,779 | B1 | 8/2003 | Li et al. |
| 6,632,741 | B1 | 10/2003 | Clevenger et al. |
| 6,667,237 | B1 | 12/2003 | Metzler |
| 6,673,684 | B1 | 1/2004 | Huang et al. |
| 6,686,245 | B1 | 2/2004 | Mathew et al. |
| 6,689,695 | B1 | 2/2004 | Lui et al. |
| 6,706,571 | B1 | 3/2004 | Yu et al. |
| 6,709,807 | B2 | 3/2004 | Hallock et al. |
| 6,734,107 | B2 | 5/2004 | Lai et al. |
| 6,744,094 | B2 | 6/2004 | Forbes |
| 6,773,998 | B1 | 8/2004 | Fisher et al. |
| 6,794,699 | B2 | 9/2004 | Bissey et al. |
| 6,800,930 | B2 | 10/2004 | Jackson et al. |
| 6,830,853 | B1 | 12/2004 | Tzu et al. |
| 6,835,662 | B1 | 12/2004 | Erhardt et al. |
| 6,867,116 | B1 | 3/2005 | Chung |
| 6,875,703 | B1 | 4/2005 | Furukawa et al. |
| 6,878,300 | B2 | 4/2005 | Allen, III |
| 6,893,972 | B2 | 5/2005 | Rottstegge et al. |
| 6,898,780 | B2 | 5/2005 | Egorov et al. |
| 6,922,230 | B2 | 7/2005 | Govil et al. |
| 6,924,191 | B2 | 8/2005 | Liu et al. |
| 6,962,867 | B2 | 11/2005 | Jackson et al. |
| 7,015,124 | B1 | 3/2006 | Fisher et al. |
| 7,074,668 | B1 | 7/2006 | Park et al. |
| 7,084,071 | B1 * | 8/2006 | Dakshina-Murthy et al. .................. 438/717 |
| 7,151,040 | B2 | 12/2006 | Tran et al. |
| 7,183,597 | B2 | 2/2007 | Doyle |
| 7,208,379 | B2 | 4/2007 | Venugopal et al. |
| 7,288,445 | B2 | 10/2007 | Bryant et al. |
| 7,291,560 | B2 | 11/2007 | Parascandola et al. |
| 2002/0042198 | A1 | 4/2002 | Bjarnason et al. |
| 2002/0045308 | A1 | 4/2002 | Juengling |
| 2002/0063110 | A1 | 5/2002 | Cantell et al. |
| 2002/0127810 | A1 | 9/2002 | Nakamura et al. |
| 2003/0006410 | A1 | 1/2003 | Doyle |
| 2003/0044722 | A1 | 3/2003 | Hsu et al. |
| 2003/0109102 | A1 | 6/2003 | Kujirai et al. |
| 2003/0119307 | A1 | 6/2003 | Bekiaris et al. |
| 2003/0127426 | A1 | 7/2003 | Chang et al. |
| 2003/0157436 | A1 | 8/2003 | Manger et al. |
| 2003/0207207 | A1 | 11/2003 | Li |
| 2003/0207584 | A1 | 11/2003 | Sivakumar et al. |
| 2003/0230234 | A1 | 12/2003 | Nam et al. |
| 2004/0000534 | A1 | 1/2004 | Lipinski |
| 2004/0018738 | A1 | 1/2004 | Liu |
| 2004/0023475 | A1 | 2/2004 | Bonser et al. |
| 2004/0023502 | A1 | 2/2004 | Tzou et al. |
| 2004/0041189 | A1 | 3/2004 | Voshell et al. |
| 2004/0043623 | A1 | 3/2004 | Liu et al. |
| 2004/0053475 | A1 | 3/2004 | Sharma |
| 2004/0079988 | A1 | 4/2004 | Harari |
| 2004/0106257 | A1 | 6/2004 | Okamura et al. |
| 2004/0235255 | A1 | 11/2004 | Tanaka et al. |
| 2004/2035255 | | 11/2004 | Tanaka |
| 2005/0074949 | A1 | 4/2005 | Jung et al. |
| 2005/0112886 | A1 | 5/2005 | Asakawa et al. |
| 2005/0153562 | A1 | 7/2005 | Furukawa et al. |
| 2005/0164454 | A1 | 7/2005 | Leslie |
| 2005/0167394 | A1 | 8/2005 | Liu et al. |
| 2005/0186705 | A1 | 8/2005 | Jackson et al. |
| 2005/0272259 | A1 | 12/2005 | Hong |
| 2006/0003182 | A1 | 1/2006 | Lane et al. |
| 2006/0024945 | A1 | 2/2006 | Kim et al. |
| 2006/0046200 | A1 | 3/2006 | Abatchev et al. |
| 2006/0046201 | A1 | 3/2006 | Sandhu et al. |
| 2006/0046422 | A1 | 3/2006 | Tran et al. |
| 2006/0046484 | A1 | 3/2006 | Abatchev et al. |
| 2006/0083996 | A1 | 4/2006 | Kim |
| 2006/0172540 | A1 | 8/2006 | Marks et al. |
| 2006/0211260 | A1 | 9/2006 | Tran et al. |
| 2006/0216923 | A1 | 9/2006 | Tran et al. |
| 2006/0231900 | A1 | 10/2006 | Lee et al. |
| 2006/0263699 | A1 | 11/2006 | Abatchev et al. |
| 2006/0267075 | A1 | 11/2006 | Sandhu et al. |
| 2006/0273456 | A1 | 12/2006 | Sant et al. |
| 2006/0281266 | A1 | 12/2006 | Wells |
| 2007/0026672 | A1 | 2/2007 | Tang et al. |
| 2007/0045712 | A1 | 3/2007 | Haller et al. |
| 2007/0048674 | A1 | 3/2007 | Wells |
| 2007/0049011 | A1 | 3/2007 | Tran |
| 2007/0049030 | A1 | 3/2007 | Sandhu et al. |
| 2007/0049032 | A1 | 3/2007 | Abatchev et al. |
| 2007/0049035 | A1 | 3/2007 | Tran |
| 2007/0049040 | A1 | 3/2007 | Bai et al. |
| 2007/0050748 | A1 | 3/2007 | Juengling |
| 2007/0210449 | A1 | 9/2007 | Caspary et al. |
| 2007/0215960 | A1 | 9/2007 | Zhu et al. |
| 2007/0275309 | A1 | 11/2007 | Liu |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |
| WO | WO 2005/034215 A1 | 4/2005 |
| WO | WO 2006/026699 A2 | 3/2006 |

OTHER PUBLICATIONS

Ex Parte Cantell, unpublished decision of the Board of Patent Appeals and Interferences, Mar. 4, 2005.

"Resolution Enhancement Techniques for the 90nm Technology Node and Beyond," Future Fab International, Issue 15, Jul. 11, 2003, 4 pages; Bergeron, et al.

"Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages; Bhave et al.

"Pattern multiplication method and the uniformity of nanoscale multiple lines," J.Vac.Sci.Technol. B21(4), Jul./Aug. 2003, pp. 1491-1495; Chung et al.

"Nanoscale Multi-Line Patterning Using Sidewall Structure," Jpn., J. App..Phys. vol. 41 (2002) Pt. 1, No. 6B, pp. 4410-4414; Chung et al.

"Nanometer scale linewidth control during etching of polysilicon gates in high-density plasmas," Microelectronic Engineering 69 (2003), pp. 350-357; Joubert et al.

"Pattern transfer into low dielectic materials by high-density plasma etching," Solid State Tech., May 2000, 6 pages; Oehrlein et al.

Choi et al., "Sublithographic nanofabrication technology for nanocatalysts and DNA chips," *J. Vac. Sci. Technol.*, pp. 2951-2955 (Nov./Dec. 2003).

Bruek, S.R.J., "Optical and interferometric lithography—Nanotechnology enablers," *Proceedings of the IEEE*, vol. 93, No. 10, Oct. 2005, pp. 1704-1721.

Sheats et al., "Microlithography: Science and Technology," *Marcel Dekkar, Inc.*, pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

* cited by examiner

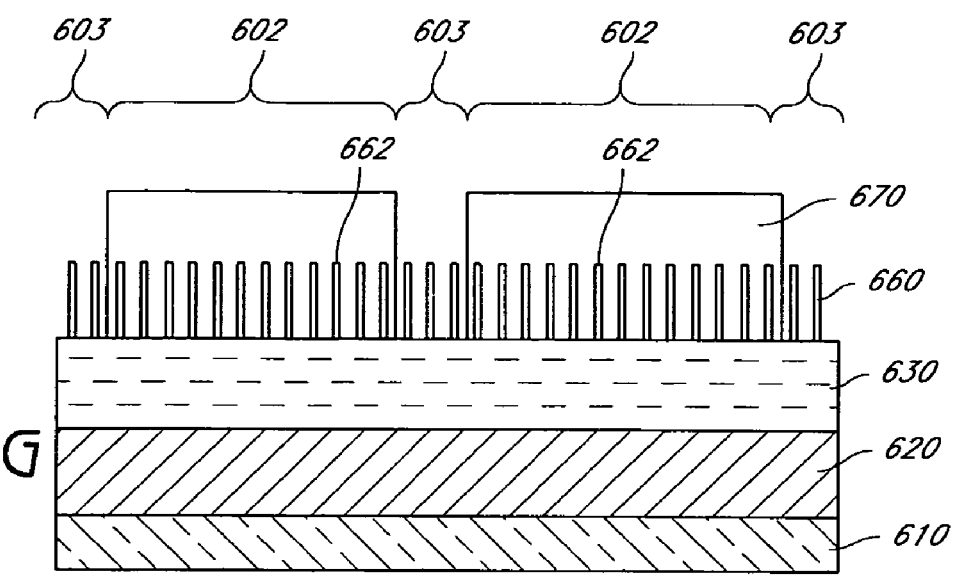
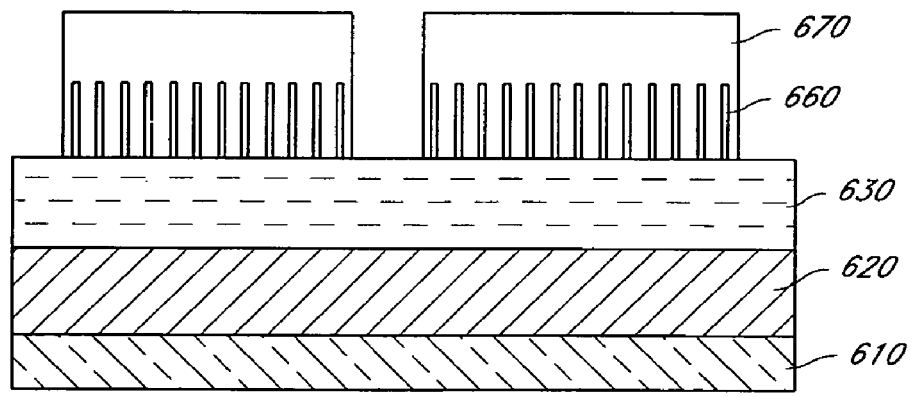
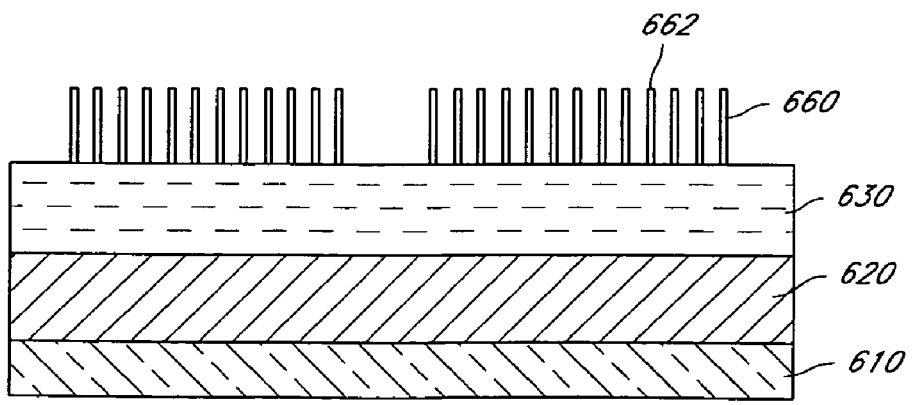

PROCESS FOR IMPROVING CRITICAL DIMENSION UNIFORMITY OF INTEGRATED CIRCUIT ARRAYS

CROSS-REFERENCE TO RELATED APPLICATIONS

This application is related to and incorporates the following by reference in their entireties: U.S. patent application Ser. No. 10/931,772 to Abatchev et al., filed Aug. 31, 2004; U.S. patent application Ser. No. 10/934,778 to Abatchev et al., filed Sep. 2, 2004; and U.S. patent application Ser. No. 11/214,544 to Tran et al., filed Aug. 29, 2005.

BACKGROUND OF THE INVENTION

1. Field of the Invention

The present invention relates to the field of integrated circuit fabrication, particularly to a process for improving critical dimension uniformity for integrated circuit arrays.

2. Description of the Related Art

In the semiconductor industries, integrated circuit (IC) devices have become faster, smaller, and more efficient. This trend has continued with the development of fabrication technology to increase circuit densities on chips.

Reducing critical dimension is one important way to increase circuit densities. The critical dimension (CD) is the dimension of the smallest geometrical features (width of interconnect line, contacts, trenches, etc.) formed during semiconductor device manufacturing. Critical dimensions need to be reduced in order to facilitate the formation of smaller features and faster, more efficient circuits.

In fabricating certain IC devices with small CD, however, pattern non-uniformity occurs due to loading effects. Some IC devices have a number of identical circuit elements arranged in multiple arrays. Such IC devices are typically formed by simultaneously forming multiple arrays on a single semiconductor substrate. In arrays formed by certain methods, the inventors have found a tendency for edge portions to have different dimensions than central portions.

SUMMARY OF THE INVENTION

The inventors have found certain processes, particularly hard mask formation and etch processes for dense feature arrays, are particularly subject to center-to-edge non-uniformities in each array. One possible source of non-uniformity may be that etchants and deposition precursors are not uniformly diffused into edge portions and central portions of arrays during an etch process that forms the arrays. Such non-uniformity occurs more significantly with denser line and space patterns. In addition, the inventors have also found spacer formation in a pitch-doubling process to result in center-to-edge non-uniformity. During the process, deposited spacers tend to be thicker in edge portions than in central portions of arrays.

Attempts have been made to prevent such non-uniformity using Optical Proximity Correction (OPC) techniques. OPC is a reticle correction technique to remedy line-end shortening, rounding, or distortion problems in photolithography. The problems are typically caused by light refraction and scattering by edges of a patterned light blocking material in a reticle. However, the attempts have not been successful in remedying the center-to-edge non-uniformity.

BRIEF DESCRIPTION OF THE DRAWINGS

These and other aspects of the invention will be better understood from the Detailed Description of the Preferred Embodiments and from the appended drawings, which are meant to illustrate and not to limit the invention, and wherein:

FIGS. 6A-6K are schematic cross-sections illustrating a process of etching for integrated circuit device arrays in accordance with another embodiment of the invention, in which spacers are defined across several array regions prior to removal from peripheral regions;

DETAILED DESCRIPTION OF THE PREFERRED EMBODIMENTS

Definitions

Figure 1A:
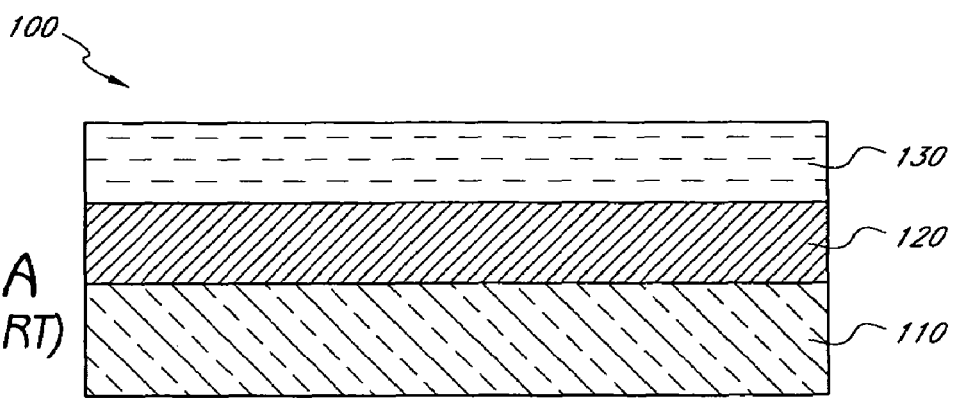
FIGS. 1A-1D are schematic cross-sections illustrating a prior art process of etching for integrated circuit device arrays.

In the context of this document, the term "integrated circuit (IC) device" refers to a semiconductor device, including, but not limited to, a memory device and a microprocessor. The memory device may be volatile memories such as random access memories (RAMs) or non-volatile memories such as read-only memories (ROMs). Examples of RAMs include dynamic random access memories (DRAMs) and static random access memories (SRAMs). Examples of ROMs include programmable read-only memories (PROMs), erasable programmable read-only memories (EPROMs), electrically-erasable programmable read-only memories (EEPROMs), and flash memories.

The term "semiconductor substrate" is defined to mean any construction comprising semiconductor materials, including, but not limited to, bulk semiconductor materials such as a semiconductor wafer (either alone or in integrated assemblies comprising other materials thereon) and semiconductor material layers (either alone or in integrated assemblies comprising other materials). The term "substrate" refers to any supporting substrate, including, but not limited to, the semiconductor substrates described above. Also in the context of this document, the term "layer" encompasses both the singular and the plural unless otherwise indicated.

The term, "features," as used herein, refers to parts of a pattern, such as lines or spaces.

The term "array" refers to a regularly repeating pattern of IC elements on a semiconductor substrate. For example, a memory array typically has a number of identical memory cells in a matrix form. Logic arrays may similarly include repeating patterns of conductive lines and/or transistors.

The term, "target layer," as used herein, refers to a layer in which arrays are formed. A target layer may be part of a semiconductor substrate. A target layer may include metal, semiconductor, and/or insulator.

It will also be appreciated that transferring a pattern from a first (e.g., masking) level to a second level involves forming features in the second level that generally correspond to features on the first level. For example, the path of lines in the second level will generally follow the path of lines on the first level. The location of other features on the second level will correspond to the location of similar features on the first level. The precise shapes and sizes of corresponding features can vary from the first level to the second level, however due, for example, to trim and growth steps. As another example, depending upon etch chemistries and conditions, the sizes of and relative spacings between the features forming the transferred pattern can be enlarged or diminished relative to the pattern on the first level, while still resembling the same initial "pattern."

While "processing" through masks is described for preferred embodiments as etching to transfer a hard mask pattern into a target layer, the skilled artisan will appreciate that processing in other embodiments can comprise, e.g., oxidation, nitridation, selective deposition, doping, etc. through the masks.

Overall Patterning Process

Figure 1B:
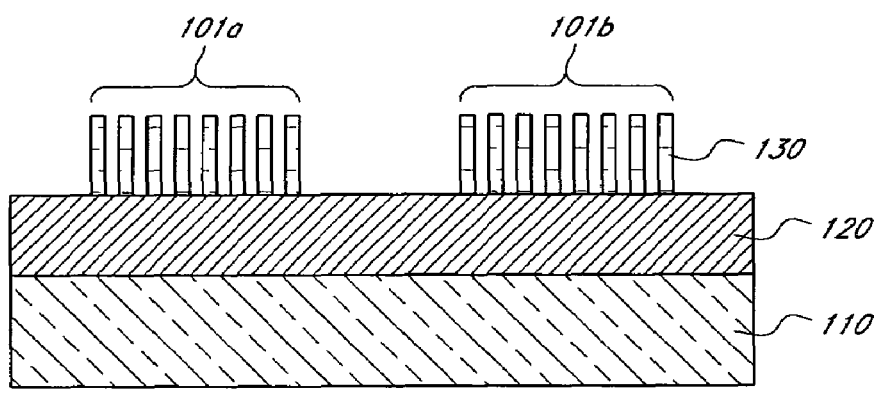
Figure 1C:
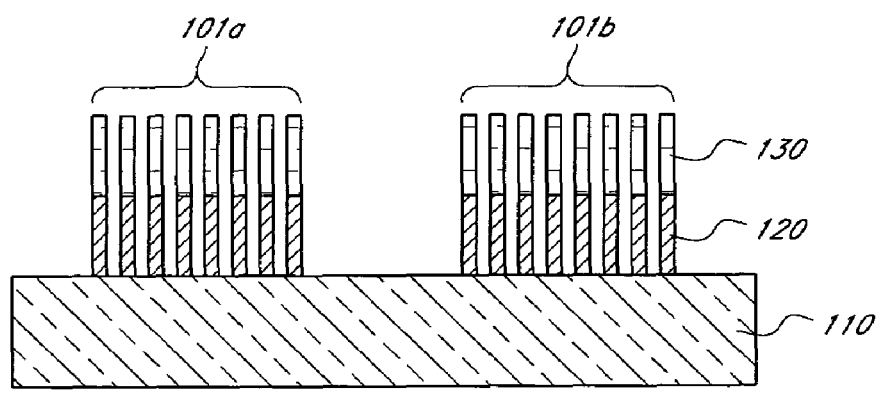
Figure 1D:
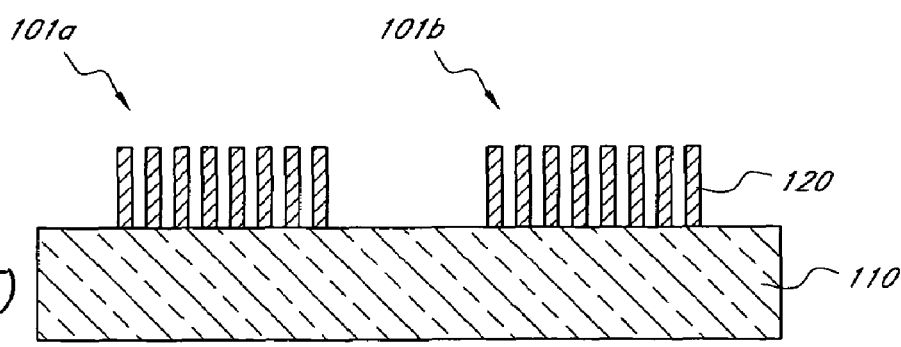
Figure 2:
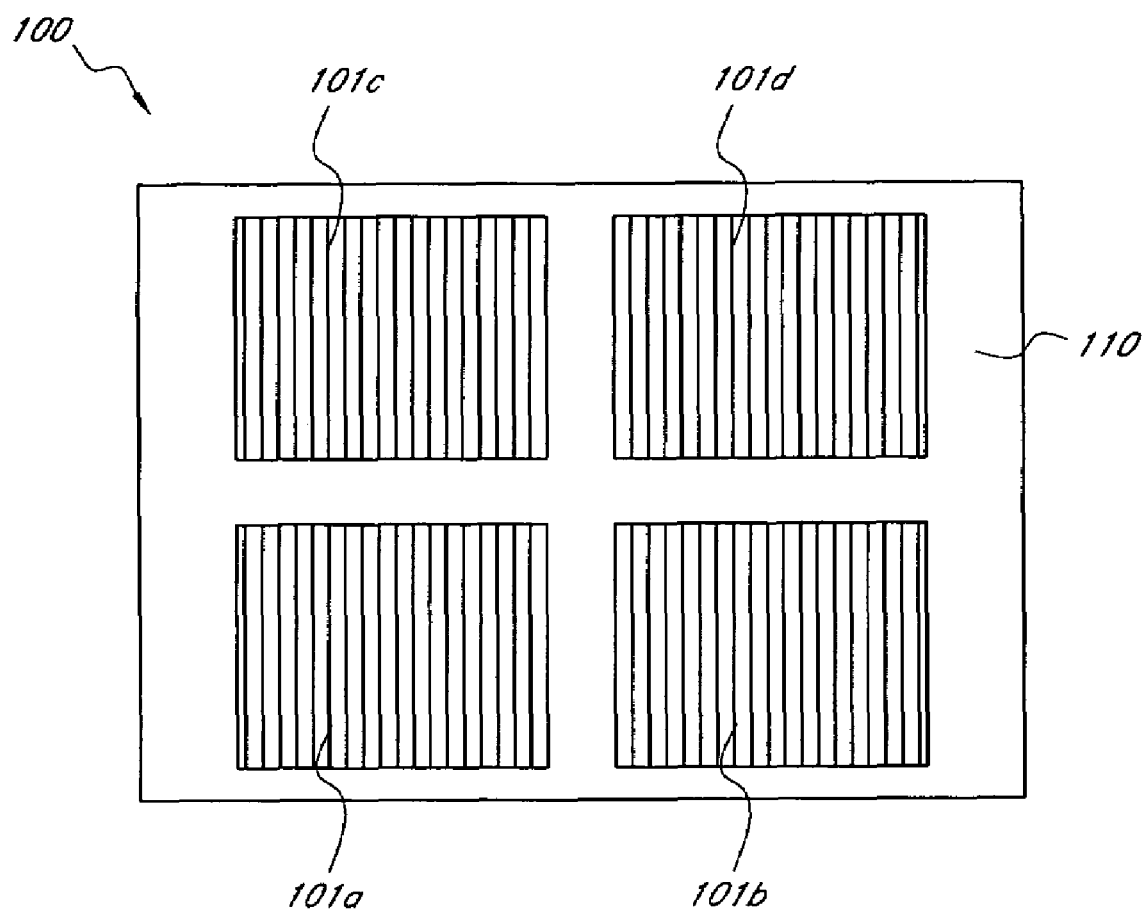
FIG. 2 is a schematic top plan view of integrated circuit device arrays resulting from the process of FIGS. 1A-1D.

FIGS. 1A-1D and 2 illustrate an exemplary prior art method of forming multiple IC arrays. As shown in FIG. 1A, a target layer 120 is provided over a substrate 110. The target layer 120 may be a hard mask layer, a spacer layer, or part of a substrate (e.g., a metal layer or interlevel dielectric). A resist layer 130 is then provided over the target layer 120. Then, the resist layer 130 is patterned to provide a mask for a plurality of arrays 101a and 101b, as shown in FIG. 1B. In addition, the resist layer 130 is patterned to expose peripheral regions. Next, as shown in FIG. 1C, the target layer 120 is etched through the patterned resist layer 130. Then, as shown in FIG. 1D, the resist layer 130 is removed, leaving arrays 101a and 101b on the substrate 110. FIG. 2 illustrates a top plan view of four exemplary arrays 101a-101d. It will be understood that the size, pattern and number of features in the arrays are simplified for purposes of illustration.

In the above prior art method, array and peripheral regions are defined at or prior to the stage at which a pattern in the resist layer 130 is transferred into the target layer 120. Thus, the features are defined only in the array regions. According to an embodiment of the invention, however, a repeating pattern of features is first formed throughout a first region of a substrate. Then, array and peripheral regions are defined within the first region at an additional masking step.

Figure 4A:
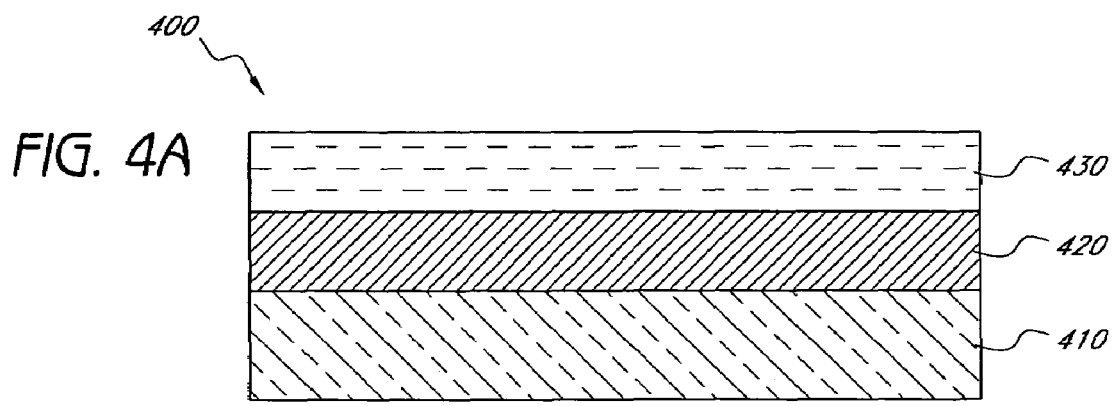
FIGS. 4A-4H are schematic cross-sections illustrating a process of etching for integrated circuit device arrays in accordance with an embodiment of the invention.
Figure 4B:
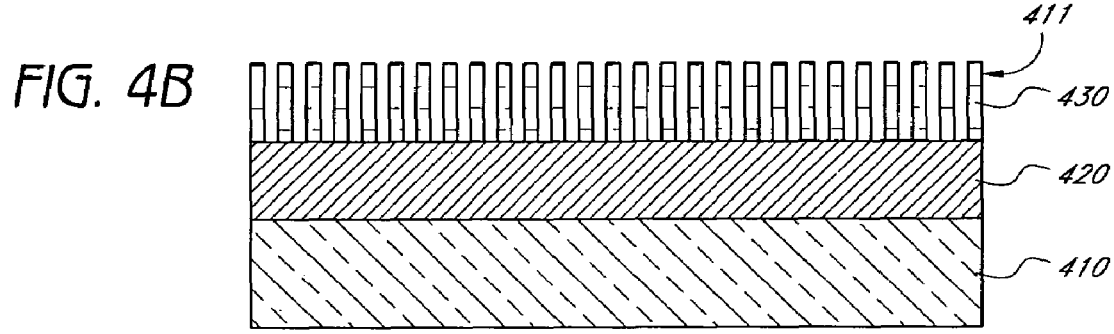

FIGS. 4A-4H and 5A-5C illustrate a method for patterning IC device arrays according to an embodiment. As shown in FIG. 4A, a target layer 420 is provided over a substrate 410. The target layer 420 may be a hard mask layer, a spacer layer, or part of the substrate 410 (e.g., a metal layer, a semiconductor layer, or an interlevel dielectric layer). A resist layer 430 is provided over the target layer 420. Next, as shown in FIG. 4B, the resist layer 430 is patterned to provide a mask for forming a repeating pattern 411 of features in the target layer 420.

Figure 4C:
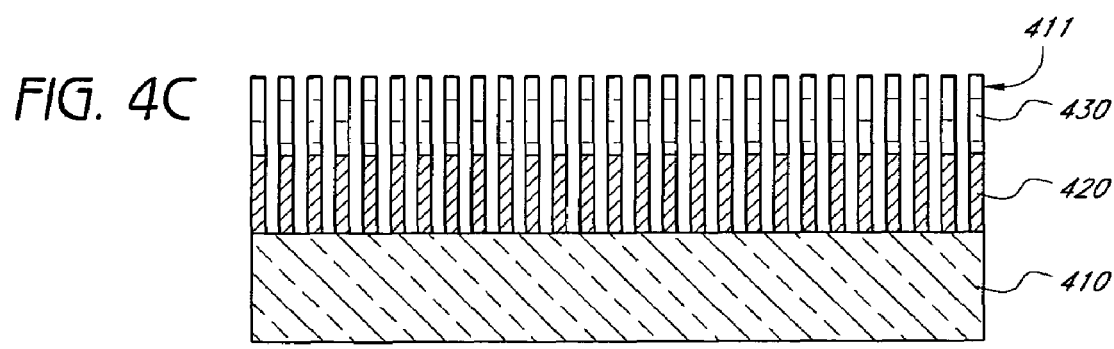
Figure 4D:
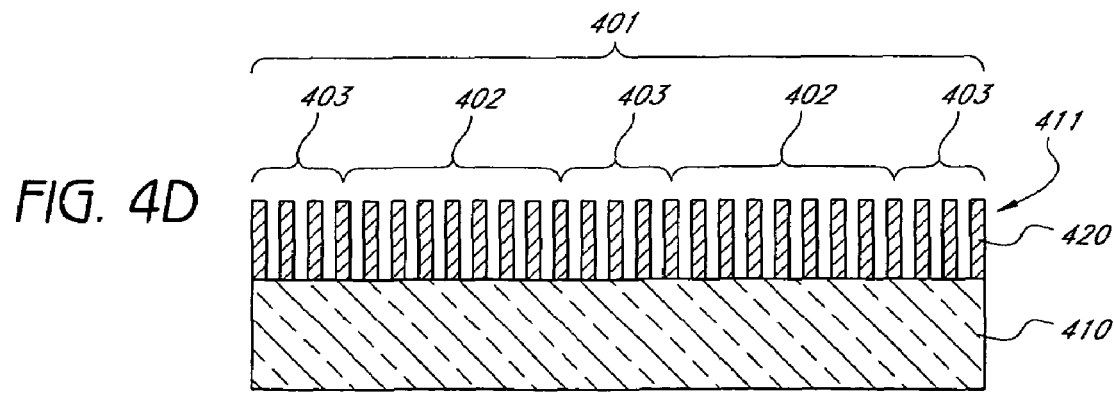
Figure 5A:
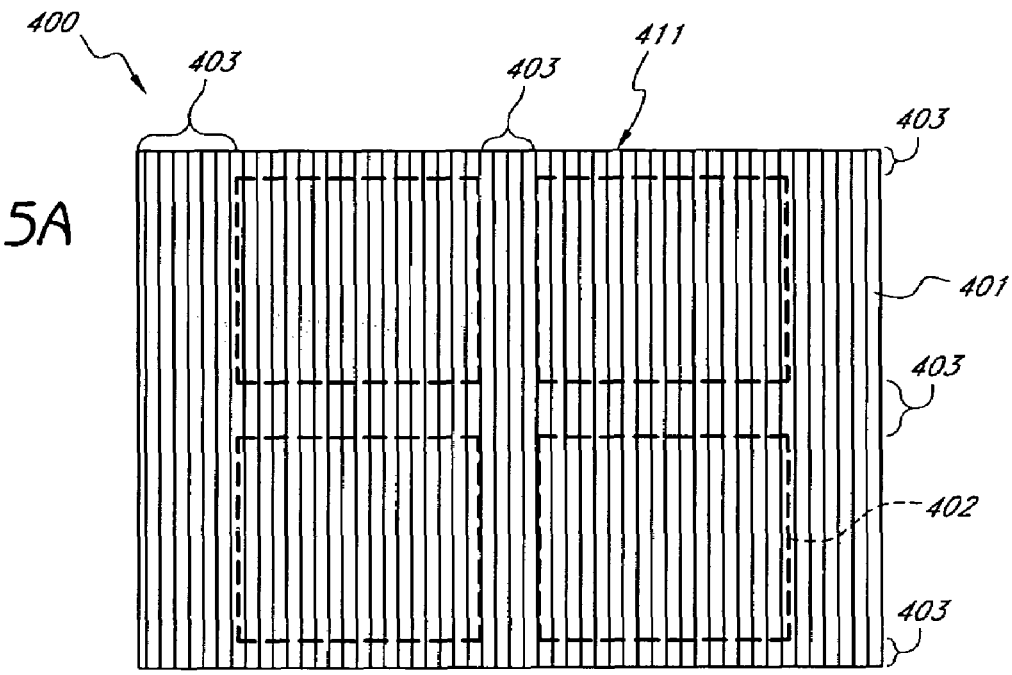
FIGS. 5A, 5B, and 5C are schematic top plan views of the integrated circuit device arrays of FIGS. 4D, 4F, and 4H, respectively.

Subsequently, the target layer 420 is processed using the patterned resist layer 430 as a mask, as shown in FIG. 4C. In the illustrated embodiment, processing comprises etching to transfer the pattern from the resist layer 430 to the target layer 420. Then, as shown in FIG. 4D, the resist layer 430 is removed, leaving only the target layer 420 having the repeating pattern of features. FIG. 5A illustrates a top plan view of the target layer 420 having a line and space pattern.

In FIGS. 4D and 5A, the repeating pattern 411 of features has been formed in the target layer 420 in a first region 401 of the substrate 410. The first region 401 may occupy a certain area of a substrate surface. The first region 401 includes a plurality of array regions 402 and peripheral regions 403. In the context of this document, array regions may also be referred to as active regions. Peripheral regions may also be referred to as inactive regions or non-array regions. The designation of "inactive" is merely a label relating to the pattern of repeating features; the skilled artisan will appreciate that active devices such as in logic circuitry are typically formed in the peripheral regions. The array regions 402 are where IC devices employing the repeating pattern (e.g., memory arrays) are to be formed, whereas different patterns of features (e.g., for memory logic circuitry) are typically formed in the peripheral regions 403. The array regions 402 are preferably in a matrix form. In the illustrated embodiment, the array regions 402 have the same pattern as each other. The peripheral regions 403 refer to regions lying between the array regions 402 and surrounding the array regions 402. In the illustrated embodiment, at this stage, the peripheral regions 403 have a repeating pattern substantially identical to that of adjoining array regions. As shown in FIG. 4D, a peripheral region 403 has the same or similar line and space pattern as an adjoining array region 402. Features in the array regions are referred to as "live features" whereas those having the same pattern in the peripheral regions are referred to as "dummy" features in the context of this document.

Figure 4E:
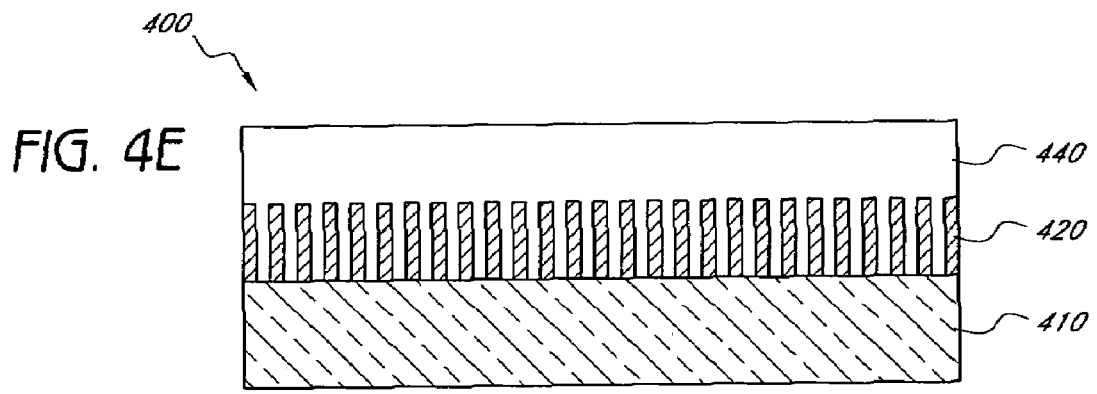
Figure 4F:
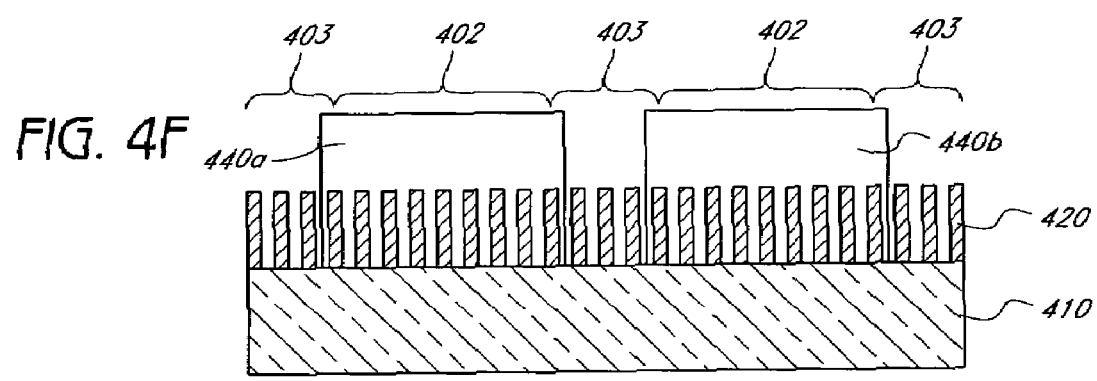
Figure 5B:
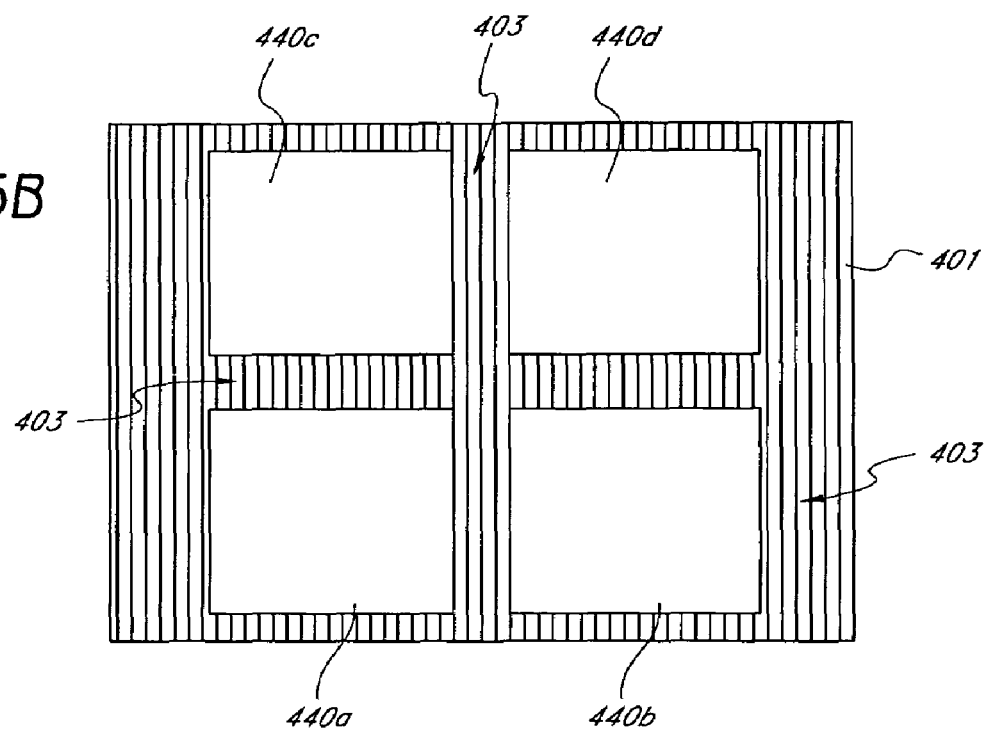

Next, as shown in FIG. 4E, an additional blocking mask layer 440 is provided over the patterned target layer 420. FIG. 4F illustrates the blocking mask layer 440 patterned to mask the array regions 402. The array regions 402 are covered by masking portions 440a and 440b of the blocking mask layer 440 whereas the peripheral regions 403 are exposed. FIG. 5B illustrates a top plan view of the first region 401 with the array regions covered by the masking portions 440a-440d. As shown in FIG. 5B, the peripheral regions 403 are exposed. In another embodiment, the blocking mask layer is configured to mask peripheral regions and expose array regions. In such an embodiment, features in the array regions are etched to form trenches while the peripheral regions remain unprocessed. This embodiment is generally applicable to a damascene process as will be described in detail with reference to FIGS. 7 and 9.

Figure 4G:
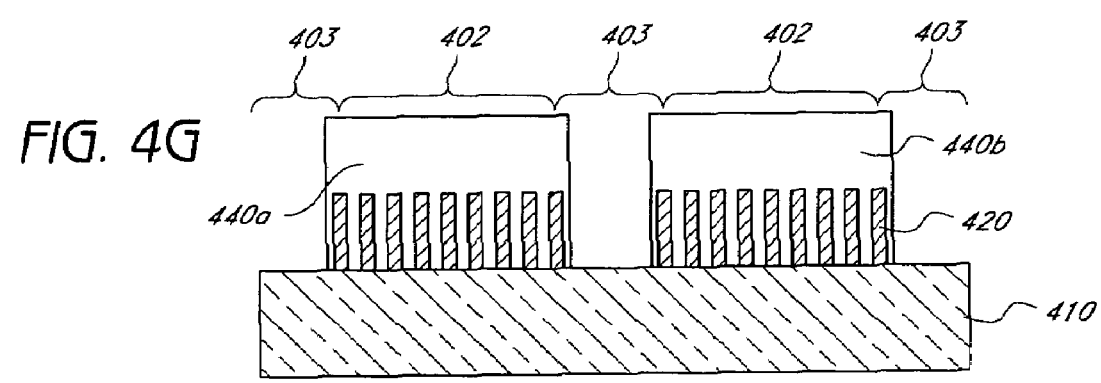
Figure 4H:
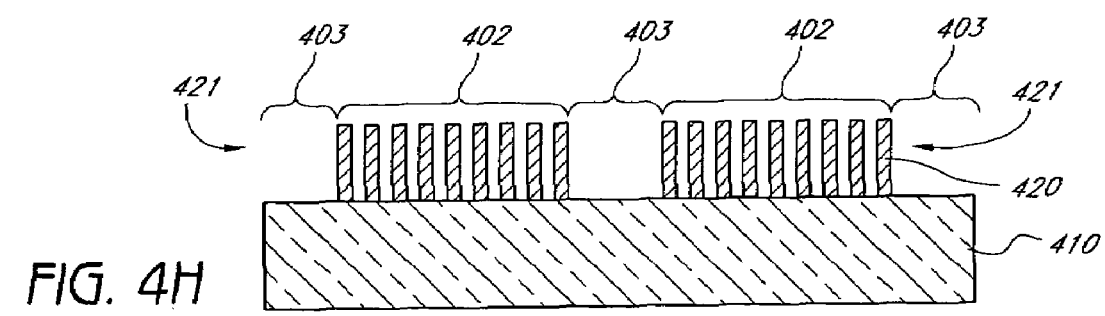
Figure 5C:
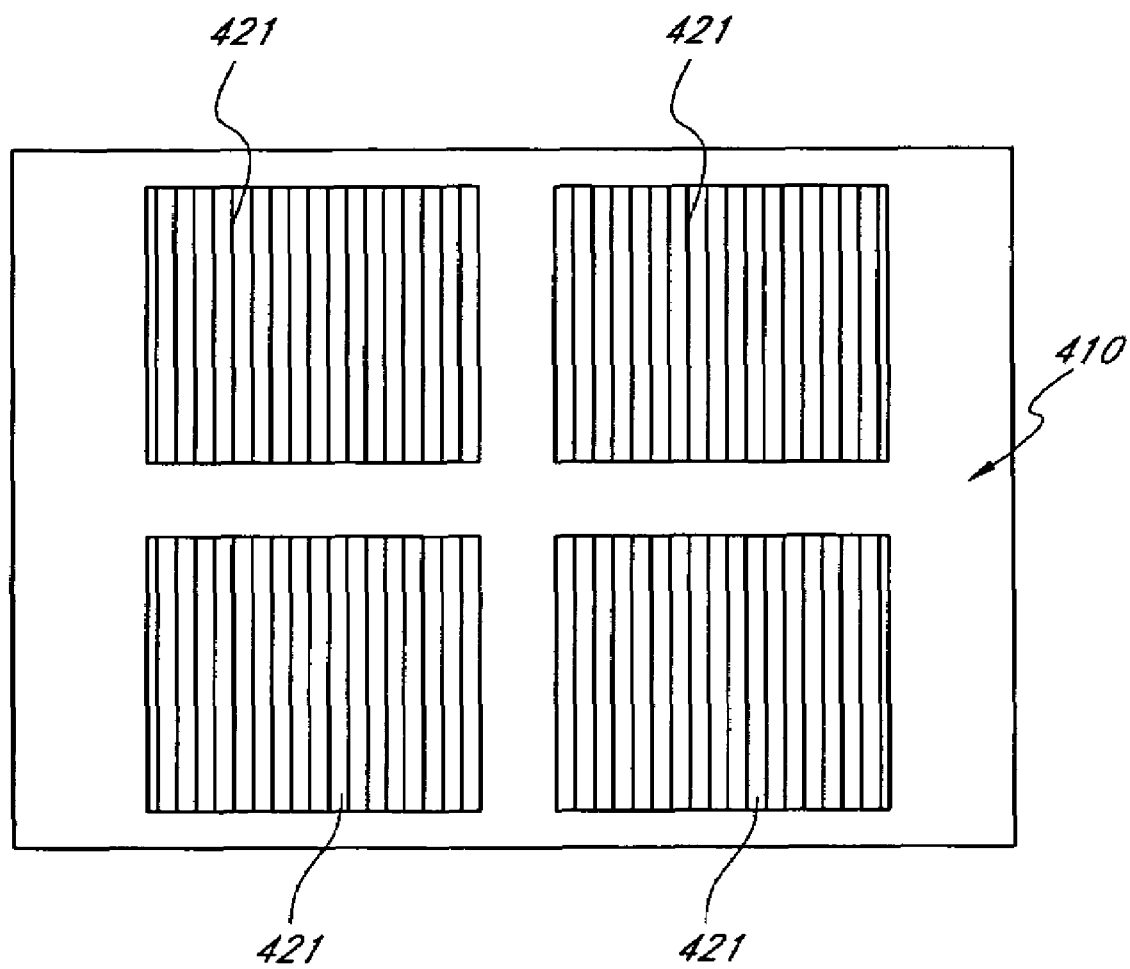

As shown in FIG. 4G, the features (dummy features) of the patterned target layer 420 in the peripheral regions 403 are etched using any conventional etch process, such as a dry etch process. Subsequently, as shown in FIG. 4H, the masking portions 440a and 440b are removed from the array regions 402. Only the array regions 402 have a pattern of features for IC elements, for example, line-and-space patterns in the illustrated embodiment. FIG. 5C illustrates a top plan view of resulting arrays 421 on the substrate 410.

Although unpictured, after forming arrays as described above, the substrate will be further provided with additional layers or materials to complete IC devices. For example, each of the array regions 421 can be further processed to complete the memory arrays. The features can represent trenches, conductive lines, portions of capacitors, portions of transistors, contacts, etc.

In the method described above, a repeating pattern of features is formed throughout a first region of a substrate before using a non-critical mask to differentiate array and peripheral regions within the first region. Thus, edge non-uniformity is pushed to outermost edges of the first region, where the features are subsequently removed. Thus, features in the array regions are subject to less local loading effects. Therefore, the center-to-edge non-uniformity can be reduced.

Additional Mask on Spacers

The non-critical additional blocking mask step described above may be performed on spacers used for a pitch doubling process. "Pitch doubling" or "pitch multiplication" is one proposed method for extending the capabilities of photolithographic techniques beyond their minimum pitch. A pitch multiplication method is described in U.S. Pat. No. 5,328,810, issued to Lowrey et al., the entire disclosure of which is incorporated herein by reference.

Figure 3A:
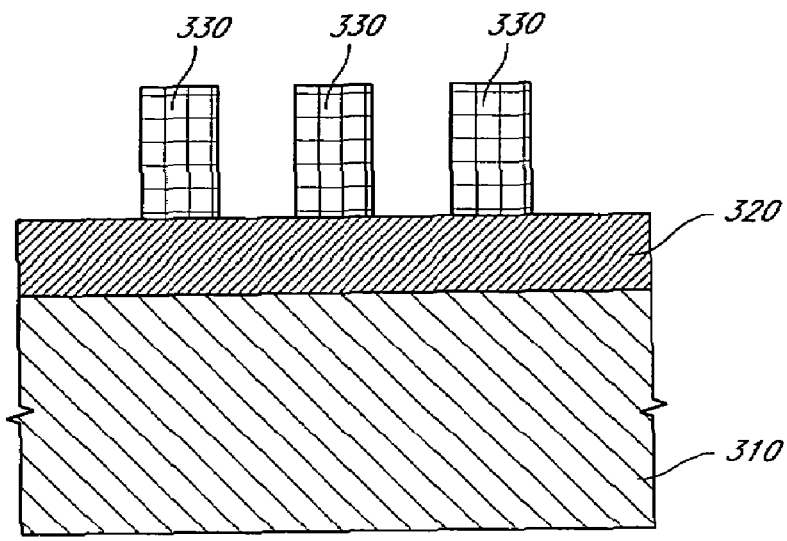
FIGS. 3A-3F are schematic cross-sections illustrating a prior art pitch-doubling process for integrated circuit devices.
Figure 3B:
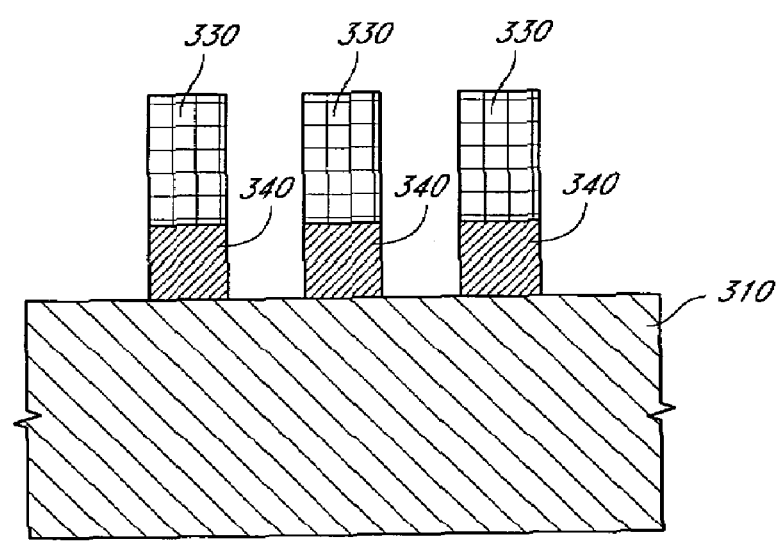
Figure 3C:
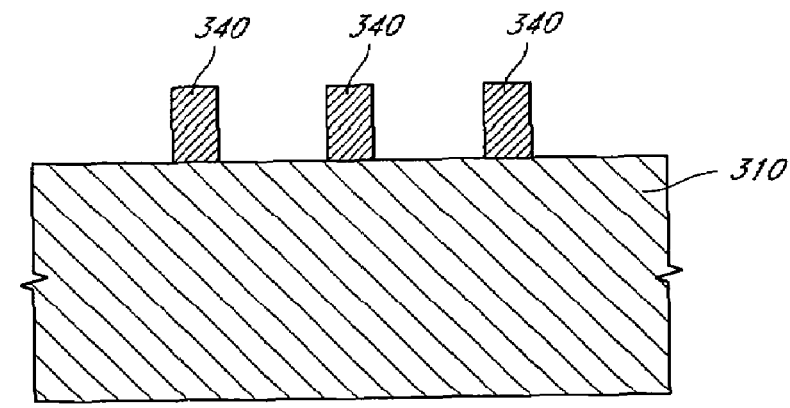
Figure 3D:
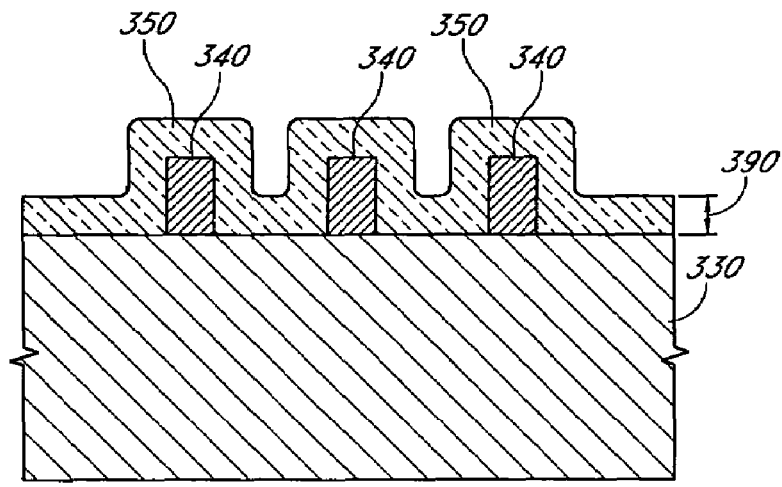
Figure 3E:
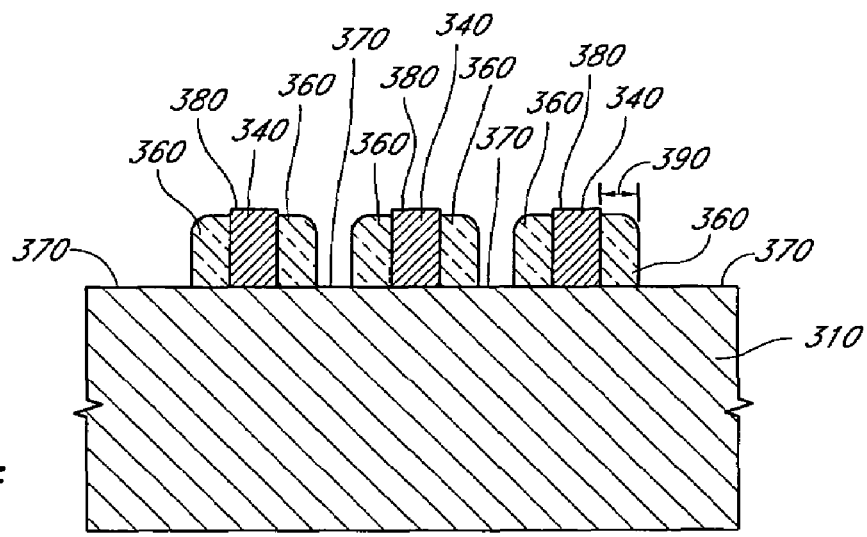
Figure 3F:
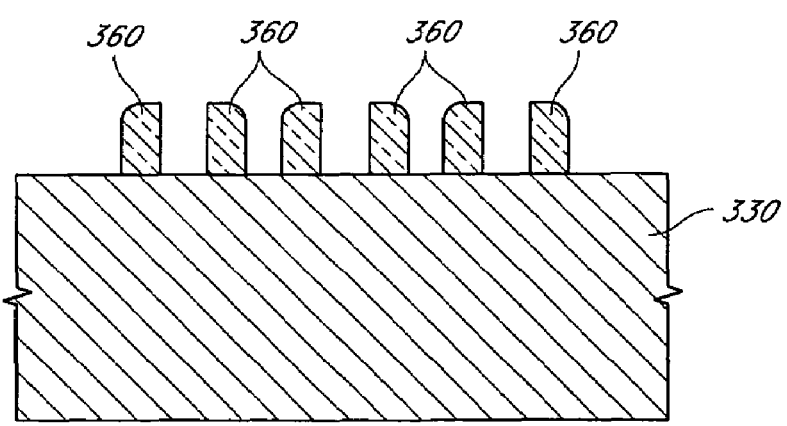

FIGS. 3A-3F illustrate a prior art pitch-doubling process for integrated circuit devices. With reference to FIG. 3A, a pattern of lines 310 is photolithographically formed in a photoresist layer, which overlies a layer 320 of an expendable material, which in turn overlies a substrate 330. As shown in FIG. 3B, the pattern is then transferred using an etch (preferably an anisotropic etch) to the layer 320, thereby forming placeholders, or mandrels, 340. The photoresist lines 310 can be stripped and the mandrels 340 can be isotropically etched to increase the distance between neighboring mandrels 340, as shown in FIG. 3C. A layer 350 of spacer material is subsequently blanket deposited over the mandrels 340, as shown in FIG. 3D. Spacers 360, i.e., the material extending or originally formed extending from sidewalls of another material, are then formed on the sides of the mandrels 340. The spacer formation is accomplished by preferentially etching the spacer material from the horizontal surfaces 370 and 380 in a directional spacer etch, as shown in FIG. 3E. The remaining mandrels 340 are then removed, leaving behind only the spacers 360, which together act as a mask for patterning, as shown in FIG. 3F. Thus, where a given pitch previously included a pattern defining one feature and one space, the same width now includes two features and two spaces, with the spaces defined by, e.g., the spacers 360. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. That is because pitch is used with two converse meanings: the distance between identical features in a repeating pattern (which decreases with increasing density) and the number of features per linear distance (which increases with increasing density).

As explained above, where a given pitch previously included a pattern defining one feature and one space, the same width now includes two features and two spaces. In other words, a pitch-doubled pattern is twice as dense as a conventional pattern. Similarly, when pitching doubling is applied to forming IC device arrays, resulting arrays have a pattern twice as dense as conventional arrays. Accordingly, the center-to-edge non-uniformity caused by loading effects is more serious in pitch-doubled arrays than in conventional arrays.

In view of the problem, preferred embodiments of the invention allow for improved center-to-edge uniformity in pitch-multiplied IC arrays. In a first phase of the method, photolithography and pitch multiplication are preferably used for forming a spacer pattern. The spacer pattern includes a repeating pattern of features in a first region of a substrate. The same repeating pattern is formed throughout the first region. Then, an additional non-critical mask step is performed to define a plurality of array regions and peripheral regions within the first region.

Figure 6A:
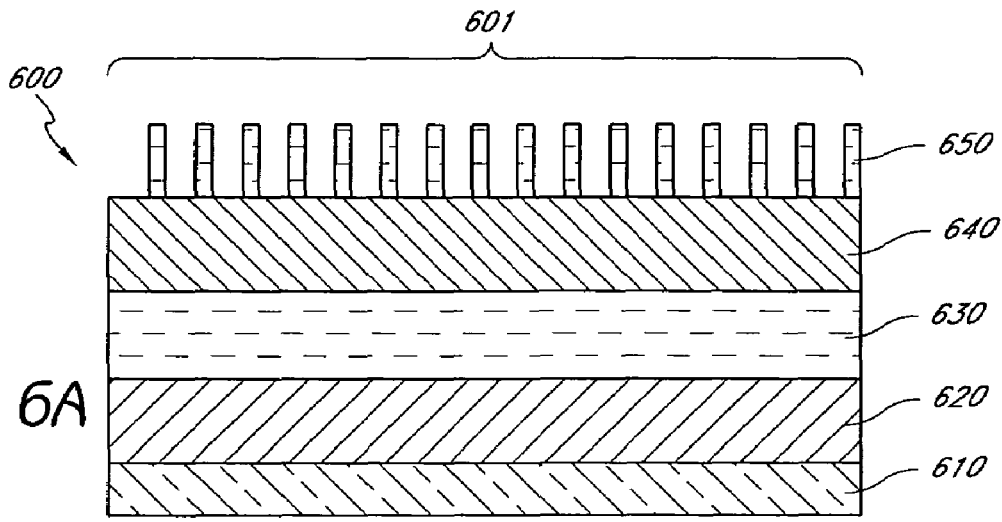

With reference to FIGS. 6A-6K, a method of patterning integrated circuit device arrays using pitch multiplication is described. As shown in FIG. 6A, a target layer 620 is provided over a substrate 610. The target layer 620 may be considered part of the substrate 610. A first hard mask layer 630 is provided over the target layer 620. A second hard mask layer 640 is provided over the first hard mask layer 630. The first hard mask is used as a mask for etching the target layer 620. In certain embodiments, the second hard mask layer 640 may be omitted.

The first hard mask layer 630 may be formed of an inorganic material. In one embodiment, the first hard mask layer 630 is formed of polysilicon, low silane oxide (LSO), silicon oxide, silicon nitride ($Si_3N_4$) or silicon oxynitride ($SiO_xN_y$). In certain embodiments, the first hard mask layer 630 may have a two-layered structure, including a silicon upper layer and an LSO lower layer or an inorganic hard-mask (e.g., 600 Å of silicon or LSO) over a supplemental hard mask layer such as transparent carbon (t-C). It should be noted that the material for the first hard mask layer 630 is chosen based on etch selectivity relative to the overlying second hard mask layer material and a spacer material which will be later described. For example, the material for the first hard mask layer 630 is preferably selectively etchable relative to the spacer material. Additionally, the (upper layer of) underlying substrate 610 is preferably selectively etchable relative to the first hard mask layer 630 such that they are of different materials. Preferably, the first hard mask layer 630 may have a thickness of between about 200 Å and about 3,600 Å, more preferably between about 600 Å and about 2,600 Å.

The second hard mask layer 640 may be formed of amorphous carbon and may serve as a sacrificial or mandrel layer for forming spacers. A preferred type of amorphous carbon is a colorless, transparent carbon that facilitates photo alignment to underlying layers. Preferably, the second hard mask layer 640 may have a thickness of between about 600 Å and about 2,000 Å, more preferably between about 1,000 Å and about 1,400 Å. Details of a pitch doubling process employing multiple hard mask layers beneath the mandrel layer are described in U.S. patent application Ser. No. 11/214,544 to Tran et al., filed Aug. 29, 2005, the entire disclosure of which is incorporated herein by reference. Thus, while illustrated with two hard mask layers, the processes described herein can employ a greater number or fewer hard mask layers.

In addition, a resist layer 650 is provided over the second hard mask layer 640. A material for the resist layer 650 is selected based on the type of lithography used for patterning the resist layer 650. Examples of such lithography include, but are not limited to, ultraviolet (UV) lithography, extreme ultraviolet (EUV) lithography, X-ray lithography and imprint contact lithography. The UV lithography includes 157 nm photolithography, 193 nm photolithography, and 248 nm photolithography. The 248 nm photolithography is also referred to as "Deep Ultraviolet (DUV)" lithography. In the illustrated embodiment, DUV photolithography is used for patterning the resist layer 650. The resist layer 650 is formed of a DUV resist which is commercially available. A skilled artisan will appreciate that the material of the layers may be varied depending on lithography, availability of selective etch chemistries and IC design.

Optionally, a bottom anti-reflective coating (BARC) layer (not shown) may be provided between the resist layer 650 and the second hard mask layer 640. BARCs, which are typically organic, enhance the resolution by preventing reflections of the ultraviolet (UV) radiation that activates the photoresist. BARCs are widely available, and are usually selected based upon the selection of the resist material and the UV wavelength. BARCs, which are typically polymer-based, are usually removed along with the overlying photoresist. The optional BARC layer preferably has a thickness of between about 200 Å and about 600 Å, more preferably between about 300 Å and about 500 Å.

In FIG. 6A, the resist layer 650 has been patterned using a DUV photolithographic process. In other embodiments, the resist layer 650 may be patterned using any suitable resist patterning technique. The illustrated resist layer 650 has a repeating pattern of features throughout a first region 601 which includes array regions and peripheral regions. The peripheral region will ultimately have no features from this pattern in the target layer 620. However, the resist 650 has been patterned to provide substantially the same features in the peripheral regions as in the array regions. In the illustrated embodiment, the pattern only includes a straight line-and-space pattern. In other embodiments, the pattern may include various other shapes.

Figure 6B:
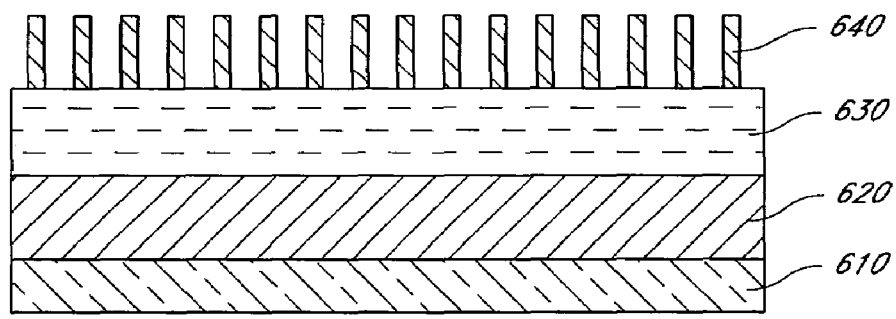

Subsequently, as shown in FIG. 6B, the second hard mask layer 640 is etched using the patterned resist 650 as a mask. The repeating pattern of features in the resist 650 is transferred into the second hard mask layer 640. The second hard mask 640 is preferably etched using a plasma etch process, most preferably a high-density plasma etch process. A pattern transfer from the resist layer 650 into the second hard mask layer 640 is preferably accomplished using an oxygen-containing plasma dry etch in Lam Research Corp.'s (Fremont, Calif.) TCP9400 poly etch chamber or Applied Material Corp.'s (Santa Clara, Calif.) IPS oxide etch chamber. Preferred precursor gases include $HBr/O_2/N_2$ and $SO_2/O_2$. The resist layer 650 is then removed, as shown in FIG. 6B. Preferably, either features in the resist layer 650 (FIG. 6A) or features in the second hard mask layer 640 (FIG. 6B) are trimmed or shrunk to increase the distance between neighboring features, as discussed with respect to FIG. 3C.

Figure 6C:
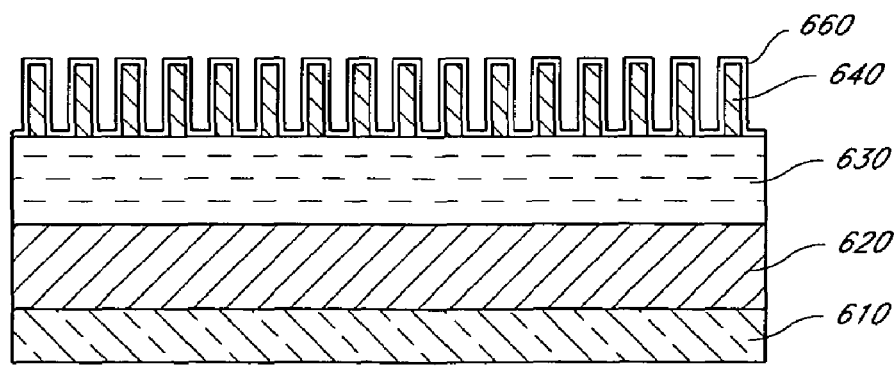

Next, as shown in FIG. 6C, a layer 660 of spacer material is blanket-deposited conformally over exposed surfaces, including the first hard mask layer 630 and the top and sidewalls of the second hard mask layer 640. The spacer material is preferably deposited by chemical vapor deposition or atomic layer deposition. The spacer material can be any material capable of use as a mask to transfer a pattern to the underlying first hard mask layer 630. The spacer material preferably: 1) can be deposited with good step coverage, 2) can be deposited at a low temperature compatible with the second hard mask layer 640 and 3) can be selectively etched relative to the second hard mask layer 640 and preferably also relative to the material directly underlying the second hard mask layer 640. In the illustrated embodiment, the spacer material 660 is silicon oxide and the underlying first hard mask layer 630 is selectively etchable, such as silicon, silicon nitride, silicon oxynitride (e.g., DARC) or silicon over LSO, which provides particular advantages in combination with other selected materials of the masking stack. In other embodiments, the spacer material may be polysilicon or low temperature oxide (LTO). In certain embodiments, the spacer deposition is performed directly on the patterned resist layer 650 (FIG. 6A). In such embodiments, the second hard mask layer 640 may be omitted.

Preferred methods for spacer material deposition include chemical vapor deposition, e.g., using $O_3$ and TEOS to form silicon oxide, and atomic layer deposition, e.g., using a silicon precursor with an oxygen or nitrogen precursor to form silicon oxides and nitrides, respectively. Atomic Layer Deposition (ALD) has the advantages of both low temperature deposition and high conformality. The thickness of the layer 660 is preferably determined based upon the desired width of the spacers 662 (FIG. 6G). For example, in one exemplary embodiment, the layer 660 is preferably deposited to a thickness of about 20-80 nm and, more preferably, about 40-60 nm. Preferably, the step coverage is about 80% or greater and, more preferably, about 90% or greater.

Figure 6D:
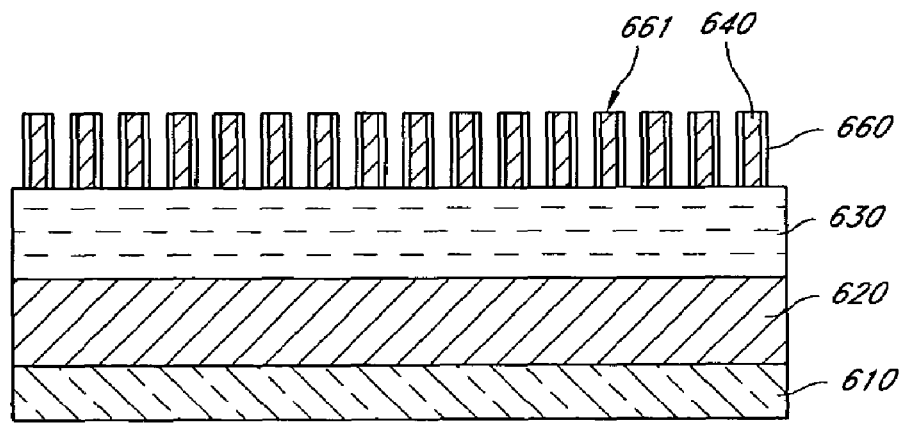

With reference to FIG. 6D, the spacer layer 660 is then subjected to an anisotropic etch to remove spacer material from horizontal surfaces 661 of the partially formed integrated circuit 600. Such an etch, also known as a spacer etch, can be performed selectively on the preferred silicon oxide material, using a fluorocarbon plasma, e.g., containing $CF_4/CHF_3$, $C_4F_8/CH_2F_2$ or $CHF_3/Ar$ plasma. These exemplary etchants are selective for silicon oxide relative to carbon of the second hard mask layer 640 and polysilicon or silicon over LSO of the first hard mask layer 630.

Figure 6E:
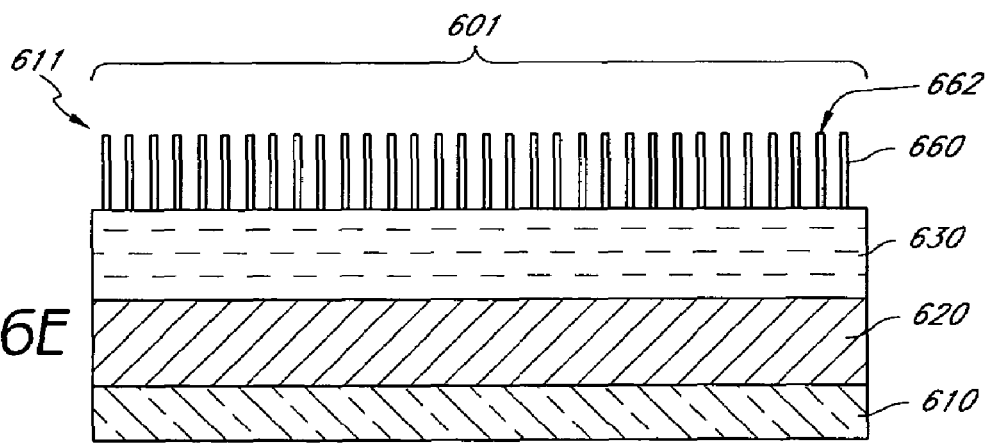

With reference to FIG. 6E, the mandrels formed in the second hard mask layer 640 are next removed to leave freestanding spacers 662. The second hard mask layer 640 is selectively removed. Preferred etch chemistries that selectively remove carbon without substantially etching inorganic materials include an oxygen-containing plasma etch, such as an etch using $HBr/O_2/N_2$ and $SO_2/O_2$.

Thus, pitch multiplication has been accomplished. In the illustrated embodiment, the pitch of the spacers 662 is roughly half that of the photoresist lines and spaces (FIG. 6A) originally formed by photolithography. Where the photoresist lines had a pitch of about 200 nm, spacers 662 having a pitch of about 100 nm or less can be formed. It will be appreciated that because the spacers 662 are formed on the sidewalls of the features or lines, the spacers 662 generally follow the outline of the pattern of features or lines in the patterned resist 650 and, so, typically form a closed loop in the spaces between the lines. The spacers 662 form a repeating pattern 611 of features in the first region 601 of the substrate.

Figure 6F:
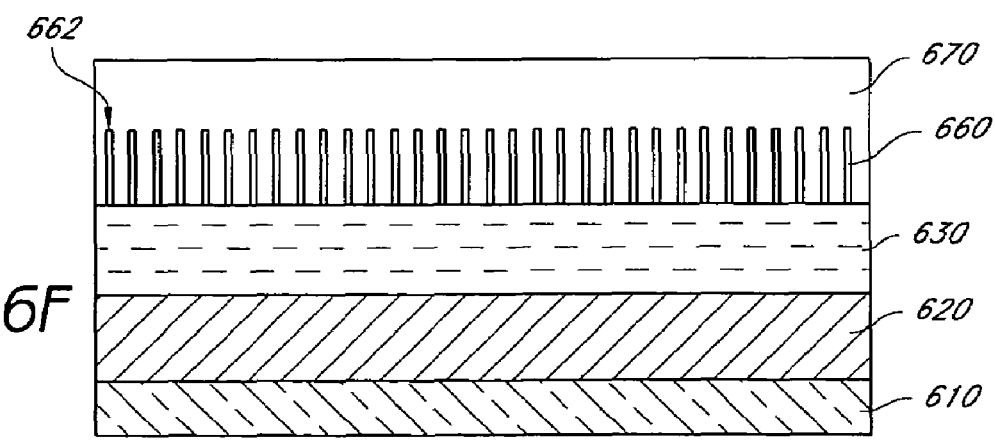

Next, in a second phase of methods according to the preferred embodiments, an additional blocking mask 670 is provided over exposed surfaces, including the first hard mask layer 630 and the top and sidewalls of the spacers 662 as shown in FIG. 6F. The additional mask 670 is preferably a soft mask and may have the same thickness and material as the blocking mask layer 440 described above with reference to FIG. 4E. Subsequently, the additional mask 670 is patterned to cover or block array regions 602 while opening peripheral regions 603 as shown in FIG. 6G.

Subsequently, spacers in the peripheral regions 603 are etched using the patterned mask 670, preferably selectively relative to the underlying first hard mask. During this step, the spacers in the peripheral regions 603 are etched away as shown in FIG. 6H.

As shown in FIG. 6I, the blocking mask 670 overlying the first hard mask layer 630 and the spacers 662 is then removed. The mask 670 is removed using any conventional process selective for the mask 670 relative to the first hard mask layer 630 and the spacers 662.

Figure 6J:
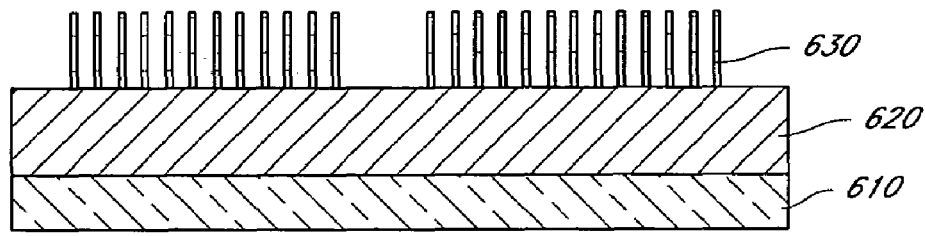
Figure 6K:
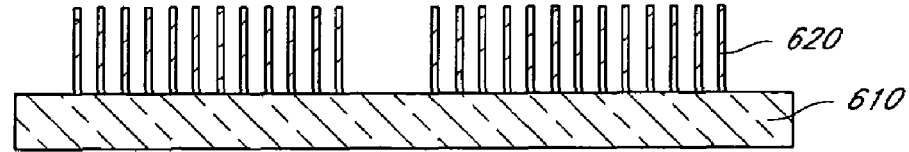

Next, a pattern provided by the spacers 662 is transferred into the first hard mask layer 630 as shown in FIG. 6J. The pattern transfer can be performed using any suitable etch process selective for the first hard mask layer 630 relative to the spacers 662. For example, in one embodiment where the first hard mask layer 630 is formed of polysilicon and the spacers 662 are formed of silicon oxide, a preferred etchant for the first hard mask layer 630 is $HBr/Cl_2$. The etch process is preferably a dry, anisotropic plasma etch process. In the illustrated embodiment, an anisotropic plasma etch process is used to minimize undesired lateral etching of the first hard mask layer 630. Preferably, the etch process is a dry develop etch (DDE) process. In one embodiment, the plasma process uses inert gases to help support the plasma. Subsequently, the spacers 662 are removed by an etch process selective for the spacers 662 relative to the first hard mask layer 630.

Then, a pattern in first hard mask layer 630 is transferred into the target layer 620 to form arrays. The pattern transfer is performed by etching the target layer 620 using the patterned first hard mask layer 630 as a mask. The etch process is preferably a dry, anisotropic etch process. Although unpictured, after forming the arrays as described above, the substrate is further processed with additional layers or materials to complete IC devices.

In the illustrated embodiment, two hard mask layers 630, 640 are employed for a pattern transfer from the resist 650 into the target layer 620. In other embodiments, only one hard mask layer or more than two hard mask layers may be used between a resist and a target layer for a pattern transfer.

In certain embodiments, the blocking mask 670 may also serve to remove or cut spacer loop ends. As described above, spacers are formed on sidewalls of features or lines, for examples, the features of the second hard mask layer 640 in FIG. 6C. The spacers thus generally follow the outline of the pattern of features or lines over which the spacers are deposited and, so, typically form a closed loop, either within trenches in the spaces between the lines, or around isolated line features. Consequently, where the pitch multiplied pattern is used to form conductive lines, additional processing steps are preferably used to cut off the ends of these loops, so that each loop forms two individual, non-connected lines. This can be accomplished, for example, by forming a protective mask around the parts of the lines to be maintained, while etching away the unprotected ends of the masks. The additional blocking mask 670 of the embodiment described above can serve as a protective mask for the parts of the lines to be maintained. Details about other methods for cutting off the ends of the loops are disclosed in U.S. patent application Ser. No. 10/931,771 to Tran et al., filed Aug. 31, 2004, the entire disclosure of which is incorporated be reference herein.

Additional Mask on Spacers in Damascene Process

In another embodiment, the additional mask step described above may be performed for a pitch doubling process in conjunction with a process for forming a damascene structure. A "damascene" structure refers to a structure having metal structures inlaid within recesses formed in a layer of dielectric. The metal may constitute an interconnect line. The inlaid metal of the damascene structure is typically isolated within trenches by means of a chemical-mechanical planarization or polishing (CMP) process. In a conventional damascene process, trenches are first defined lithographically in a dielectric layer. Then, a metal is deposited to fill the trenches. Subsequently, excess metal is removed by CMP.

Figure 7A:
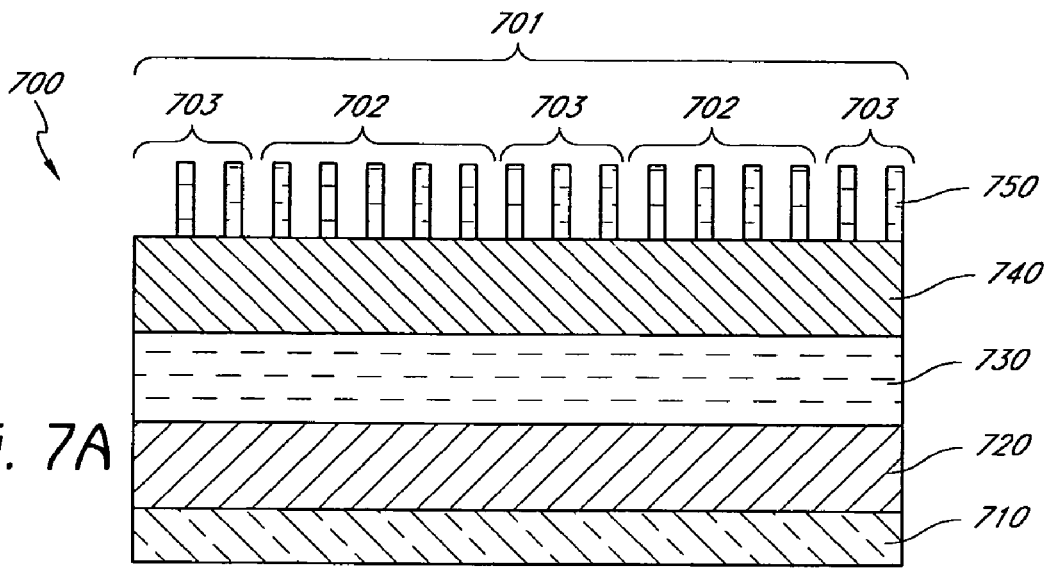
FIGS. 7A-7J are schematic cross-sections illustrating a damascene process for integrated circuit device arrays in accordance with another embodiment of the invention, in which spacers are defined across several array regions and their transfer to a lower level is blocked in peripheral regions.

With reference to FIGS. 7A-7J, a damascene process for forming integrated circuit device arrays using pitch doubling is provided. As shown in FIG. 7A, a target layer 720 is provided over a substrate 710. The target layer is formed of a dielectric material, typically a form of silicon oxide such as TEOS, BPSG on newer low-k materials. A first hard mask layer 730 is provided over the target layer 720. A second hard mask layer 740 is provided over the first hard mask layer 730. The hard mask layers 730, 740 may have the same thickness and material as those in the pitch doubling process described above.

In addition, a resist layer 750 is provided and patterned over the second hard mask layer 740. In FIG. 7A, the resist 750 has a repeating pattern of features throughout a first region 701, which includes array regions 702 and peripheral regions 703. The peripheral regions 703 will ultimately have no features in the target layer 720. However, the resist 750 has been patterned to provide substantially the same features in the peripheral regions 703 as in the array regions 702.

Figure 7B:
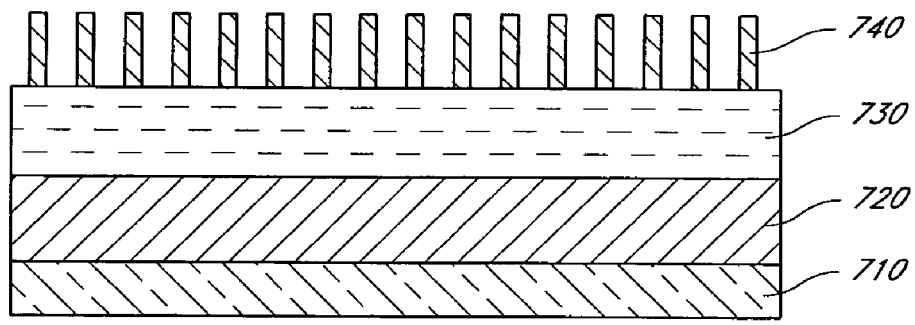

Subsequently, as shown in FIG. 7B, the second hard mask layer 740 is etched using the patterned resist 750 as a mask. The repeating pattern of features in the resist 750 is transferred into the second hard mask layer 740. Preferably, trimming or shrinking is performed either at the resist 750 stage (FIG. 7A) or at the second hard mask 740 stage (FIG. 7B) to increase the distance between neighboring features, as discussed with respect to FIG. 3C.

Figure 7C:
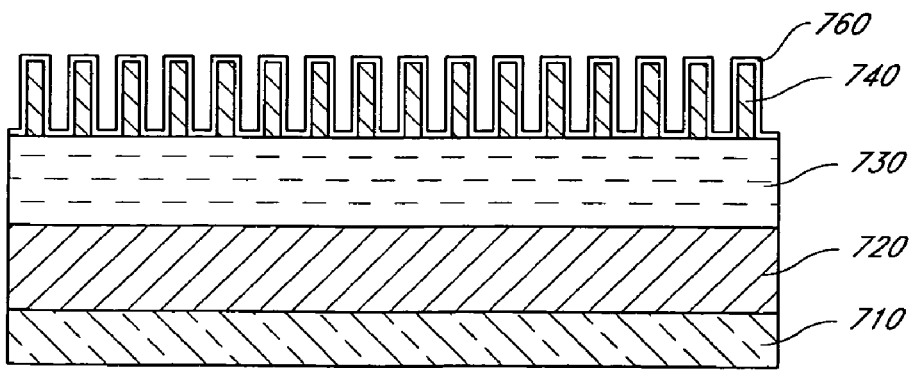

Next, as shown in FIG. 7C, a layer 760 of spacer material is blanket-deposited conformally over exposed surfaces, including the first hard mask layer 730 and the top and sidewalls of the second hard mask layer 740. The spacer material can be any material capable of use as a mask to transfer a pattern to the underlying first hard mask layer 730. In the illustrated embodiment, the spacer material is silicon oxide, which provides particular advantages in combination with other selected materials of the masking stack.

Preferred methods for spacer material deposition include chemical vapor deposition, e.g., using $O_3$ and TEOS to form silicon oxide, and atomic layer deposition, e.g., using a silicon precursor with an oxygen or nitrogen precursor to form silicon oxides and nitrides, respectively. The thickness of the layer 760 is preferably determined based upon the desired width of the spacers 762 (FIG. 7F). For example, in the one exemplary embodiment, the layer 760 is preferably deposited to a thickness of about 20-80 nm and, more preferably, about 40-60 nm. Preferably, the step coverage is about 80% or greater and, more preferably, about 90% or greater.

Figure 7D:
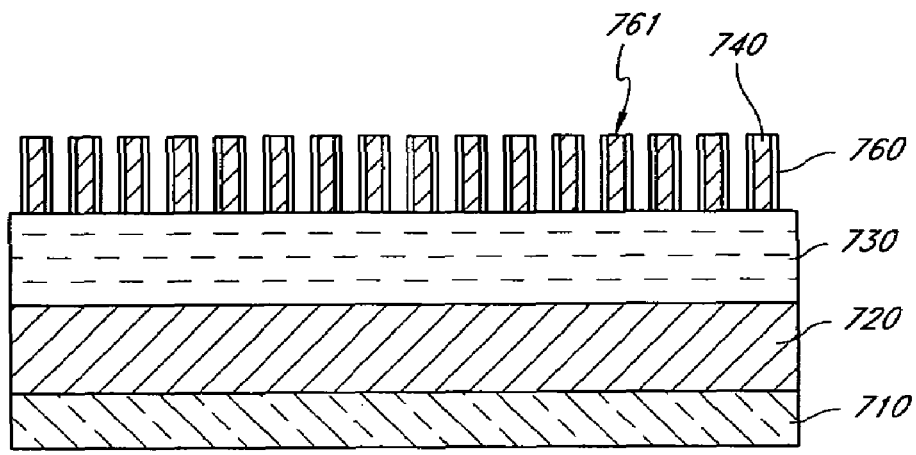

With reference to FIG. 7D, the spacer layer 760 is then subjected to an anisotropic etch to remove spacer material from horizontal surfaces 761 of the partially formed integrated circuit 700. Such an etch, also known as a spacer etch, can be selectively performed for the preferred silicon oxide material 760 using a fluorocarbon plasma, e.g., containing $CF_4/CHF_3$, $C_4F_8/CH_2F_2$ or $CHF_3/Ar$ plasma.

Figure 7E:
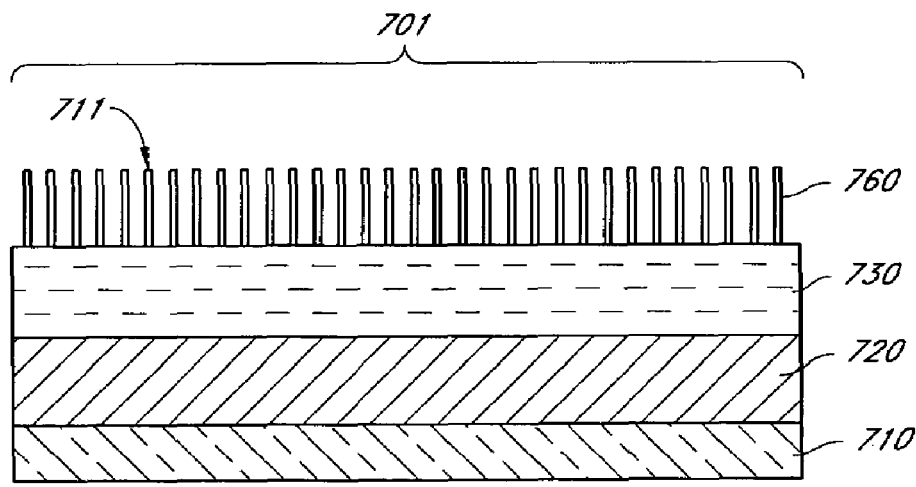
Figure 7F:
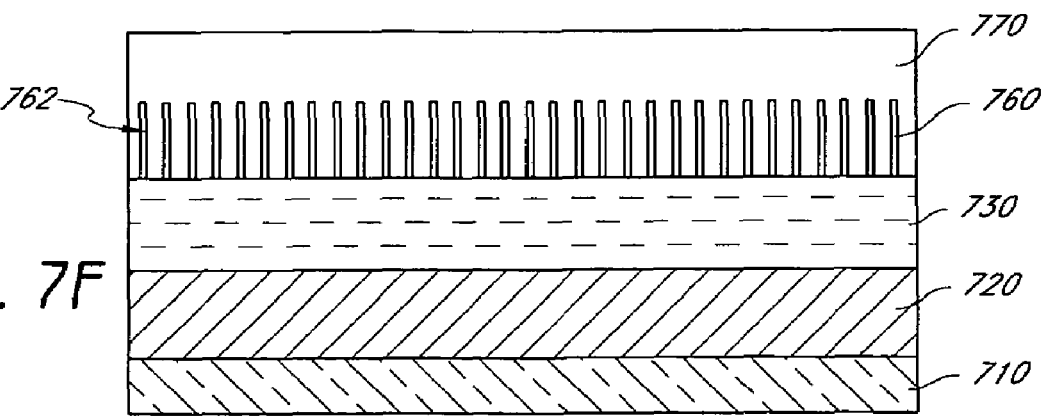

With reference to FIG. 7E, the mandrels formed by the second hard mask layer 740 are next removed to leave freestanding spacers 762. The second hard mask layer 740 is selectively removed. Preferred etch chemistries for the preferred carbon mandrels include an oxygen-containing plasma etch, such as an etch using $HBr/O_2/N_2$ and $SO_2/O_2$. The resulting spacers 762 form a repeating pattern 711 of features in the first region 701 of the substrate.

Next, in a second phase of methods according to the preferred embodiments, an additional blocking mask 770 is provided over exposed surfaces, including the first hard mask layer 730 and the top and sidewalls of the spacers 762 as shown in FIG. 7F. The additional mask 770 may have the same thickness and material as the mask 670 described above with reference to FIG. 6F.

Figure 7G:
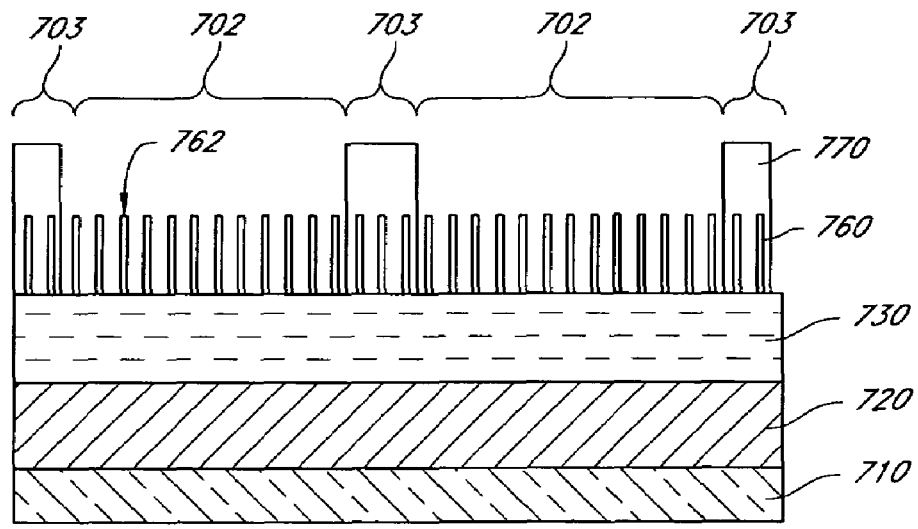

Subsequently, the additional mask 770 (a non-critical mask with large dimensions) is patterned to open array regions 702, as shown in FIG. 7G, while covering peripheral regions 703.

By this step, the top and sidewalls of the spacers 762 and parts of the upper surface of the first hard mask layer 730 in the array regions 702 are exposed.

Figure 7H:
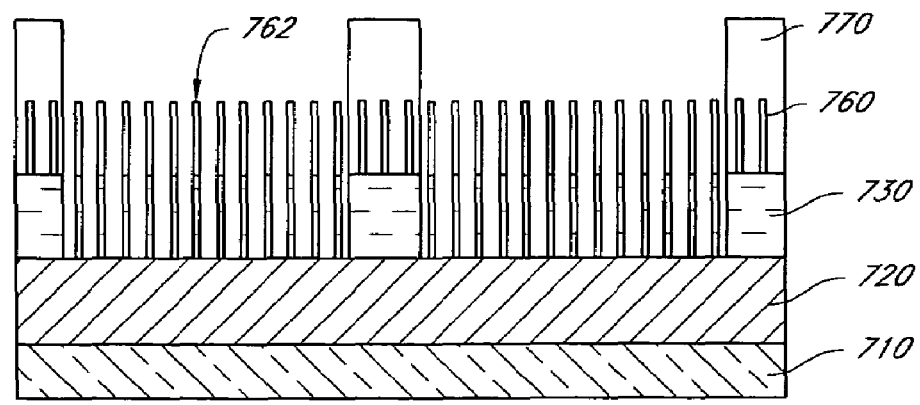

Subsequently, the first hard mask layer 730 in the array regions 702 is etched through the patterned mask layer 770 and the patterned spacers 762, as shown in FIG. 7H. Preferably, an anisotropic plasma etch process is used for etching the first hard mask layer. By this step, a pattern provided by the spacers 762 is transferred into the first hard mask layer 730.

Figure 7I:
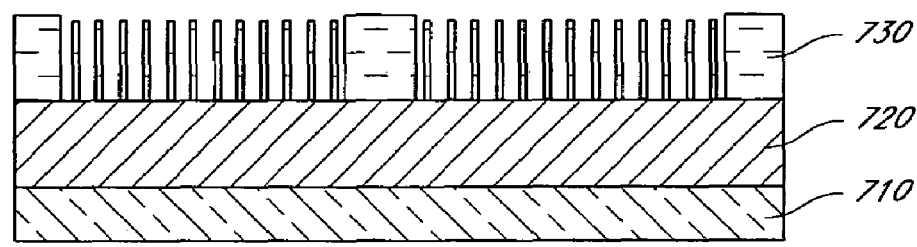

Next, the blocking mask 770 overlying the spacers 762 in the peripheral regions 703 is removed using any suitable process. In addition, the spacers 762 are removed using an etch process, as shown in FIG. 7I, leaving behind the patterned first hard mask layer 730. The first hard mask layer 730 now has a line and space pattern in the array regions 702, but not in the peripheral regions 703.

Figure 7J:
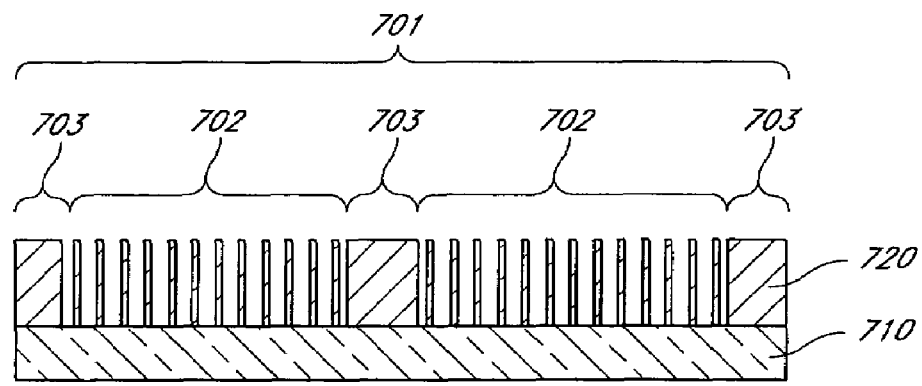

Next, the line and space pattern of the first hard mask layer 730 is transferred into the target layer 720, as shown in FIG. 7J. The pattern transfer can be performed using any suitable etch process selective for the target layer 720 relative to the first hard mask layer 730. The etch process is preferably a dry, anisotropic etch process. In the illustrated embodiment, an anisotropic plasma etch process for etching the target layer 720. Subsequently, the first hard mask layer 730 is removed by an etch process selective for the first hard mask layer 730 relative to the target layer 720. Although undepicted, after forming trenches in the array regions 702 as described above, the substrate may be further provided with a metallic material or its alloy. Next, excess metal may be planarized using any conventional polishing or planarizing method to complete a damascene structure.

In the illustrated embodiment, two hard mask layers 730, 740 are employed for a pattern transfer from the resist 750 into the target layer 720. In other embodiments, only one hard mask layer or more than two hard mask layers may be used for a pattern transfer between a resist and a target layer. In certain embodiments, a pattern in the spacer layer 760 (FIG. 7G) is transferred into the substrate or target layer 720 without removing the spacer layer 760 and the blocking mask 770 as shown in FIG. 7I. The pattern in the spacer layer 760 can be transferred into the target layer 720 by a single etch step or consecutive etch steps, whether or not the intervening first hard mask layer 730 is used.

The blocking mask 770 can also be used for blocking spacer loop ends of the live (array) features, such that these portions of the patterns are not etched into the dielectric target layer 720.

Additional Mask on Hard Mask

Referring to FIGS. 8A-8I, a method of patterning and etching for IC device arrays using a hard mask according to another embodiment is described. In the illustrated embodiment, the hard mask is provided with a repeating pattern of features. Then, an additional (non-critical) blocking mask is provided over the patterned hard mask to define array regions and peripheral regions. This embodiment is similar to the embodiment of FIG. 4 with extra hard mask layers and intervening transfer steps.

Figure 8A:
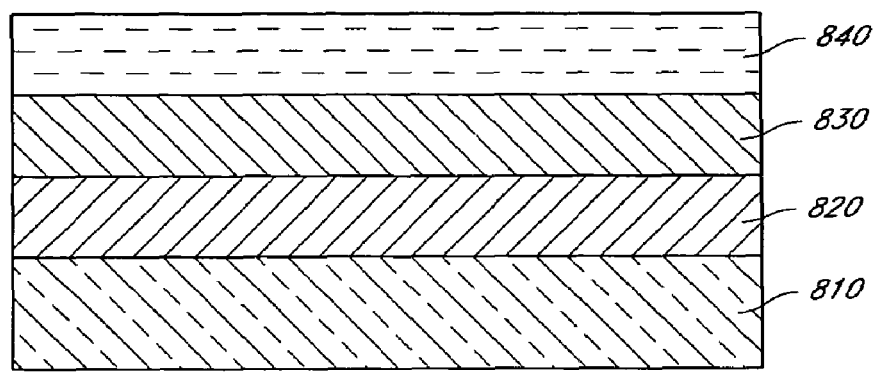
FIGS. 8A-8J are schematic cross-sections illustrating a process of etching for integrated circuit device arrays in accordance with another embodiment of the invention, in which repeating patterns are formed across several array regions prior to removal from peripheral regions.

With reference to FIG. 8A, a target layer 820 is provided over a substrate 810. The target layer 820 may be considered part of the substrate 810 and may represent, e.g., a blanket metal layer to be patterned. A hard mask layer 830 is provided over the target layer 820. In addition, a resist layer 840 is provided over the hard mask layer 830. The substrate 810, the target layer 820, and the resist layer 840 may have the same thicknesses and materials as those described above with reference to FIGS. 6 and 7.

In the illustrated embodiment, the hard mask layer 830 will be used to transfer a pattern from the resist layer 840 into the target layer 820. The hard mask layer 830 may be formed of an organic material, preferably amorphous carbon. A preferred type of amorphous carbon is a colorless, transparent carbon that facilitates photo alignment to underlying layers. The hard mask layer 830 may have a thickness of between about 1,000 Å and about 4,000 Å, more preferably between about 2,000 Å and about 3,000 Å. In certain embodiments, the hard mask layer 830 may have an upper hard mask and a lower hard mask. The upper hard mask may be formed of amorphous carbon. The lower hard mask may be formed of polysilicon, silane oxide, silicon oxide, or silicon nitride. The lower hard mask may have a two-layered structure, including a silicon top layer and a silane oxide bottom layer.

In certain embodiments in which a photolithographic process is used for patterning the resist 840, a bottom anti-reflective coating (BARC) layer (not shown) may optionally be provided between the hard mask layer 830 and the resist 840. BARCs are widely available, and are usually selected based upon the selection of the resist material and the UV wavelength. The BARC layer may have a thickness of between about 200 Å and about 1,000 Å, more preferably between about 300 Å and about 600 Å. An additional hard mask layer (not shown) may also be provided over the hard mask layer to provide excellent pattern transfer fidelity. The additional hard mask layer may be formed of a DARC.

Figure 8B:
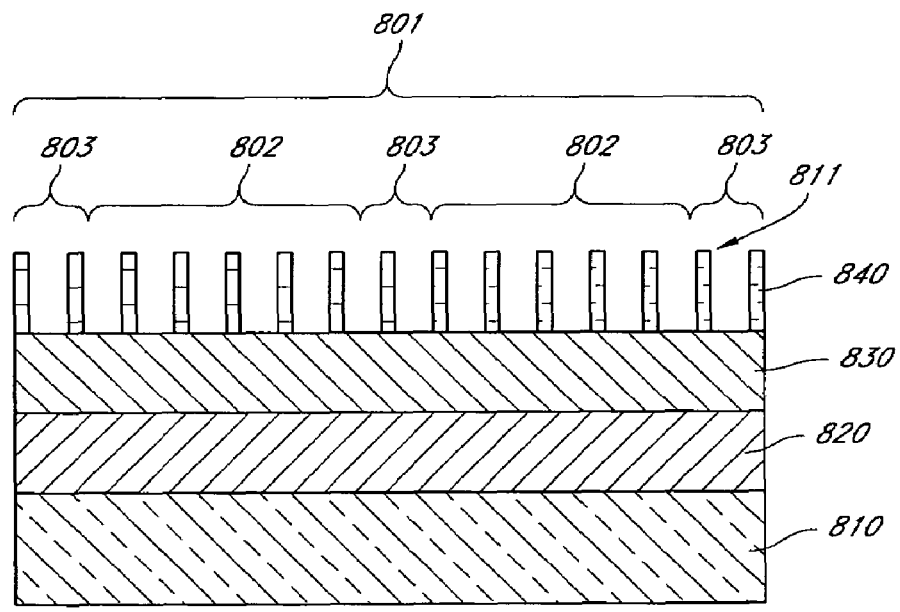

Next, as shown in FIG. 8B, the resist layer 840 is patterned to provide a repeating pattern 811 of features in a first region 801 of the substrate 810. The first region 801 includes a plurality of array regions 802 and peripheral regions 803 outside the array regions 802 within the first region 801. The repeating pattern is provided throughout the first region 801 without distinction of the array and peripheral regions 802, 803 which will be later defined. The array regions are where IC devices are to be formed and will include identical IC elements. The peripheral regions include gaps or spaces which surround the array regions and in which typically logic circuitry is formed. As noted, at this stage, the pattern 811 in the peripheral region is substantially similar to that of an adjacent array region.

Figure 8C:
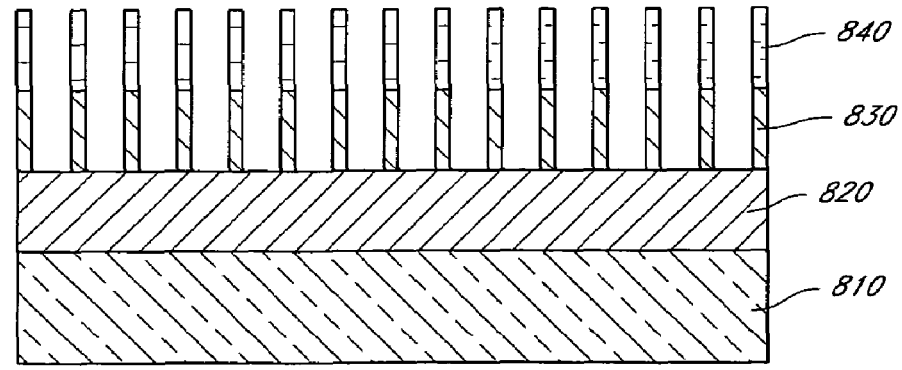

Subsequently, as shown in FIG. 8C, the pattern in the resist layer 840 is transferred into the hard mask layer 830. The pattern transfer is preferably performed by using a plasma etch process, most preferably a high-density plasma etch process. Preferably, the plasma etch process is an anisotropic etch process. This etch process may have the same chemistry and conditions as the method described for etching the hard mask layer in embodiments discussed above.

Figure 8D:
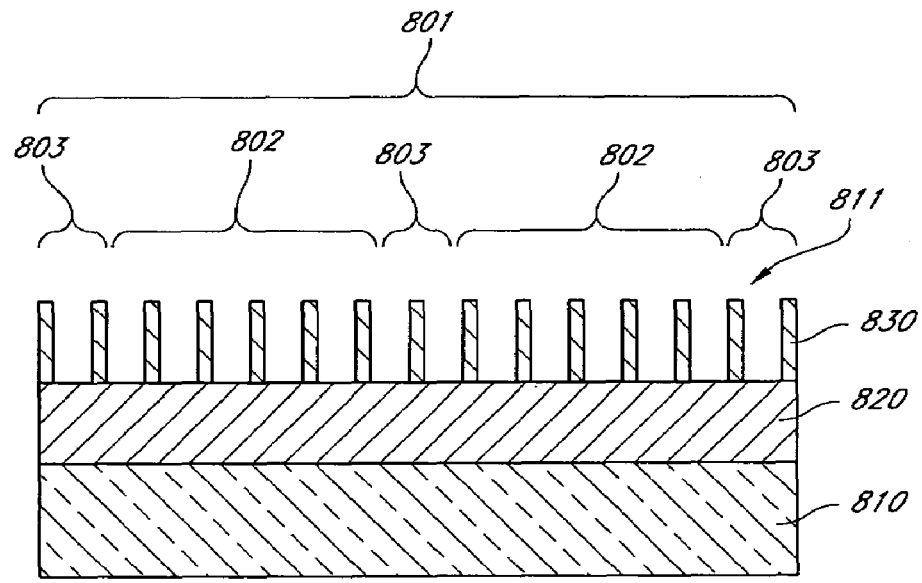

After the pattern transfer, the resist layer 840 overlying the patterned hard mask 830 is removed by any conventional method. In FIG. 8D, the resist layer 840 has been removed from over the hard mask layer 830. Trimming or shrinking can optionally be performed either at the resist 840 stage (FIG. 8B) or at the hard mask 830 stage (FIG. 8D) to increase the distance between neighboring features.

Figure 8E:
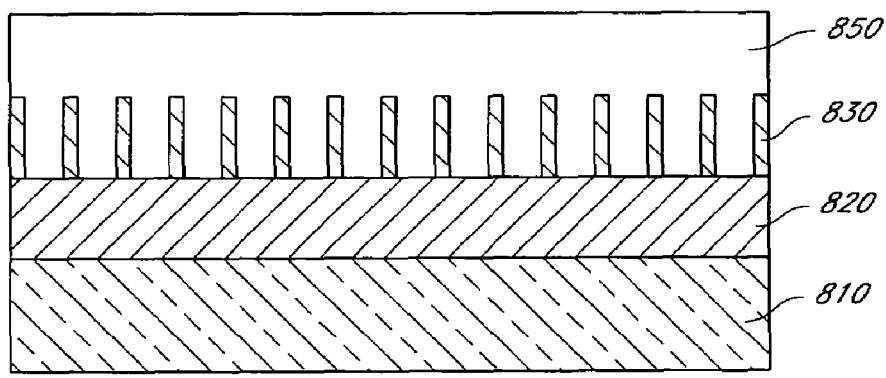
Figure 8F:
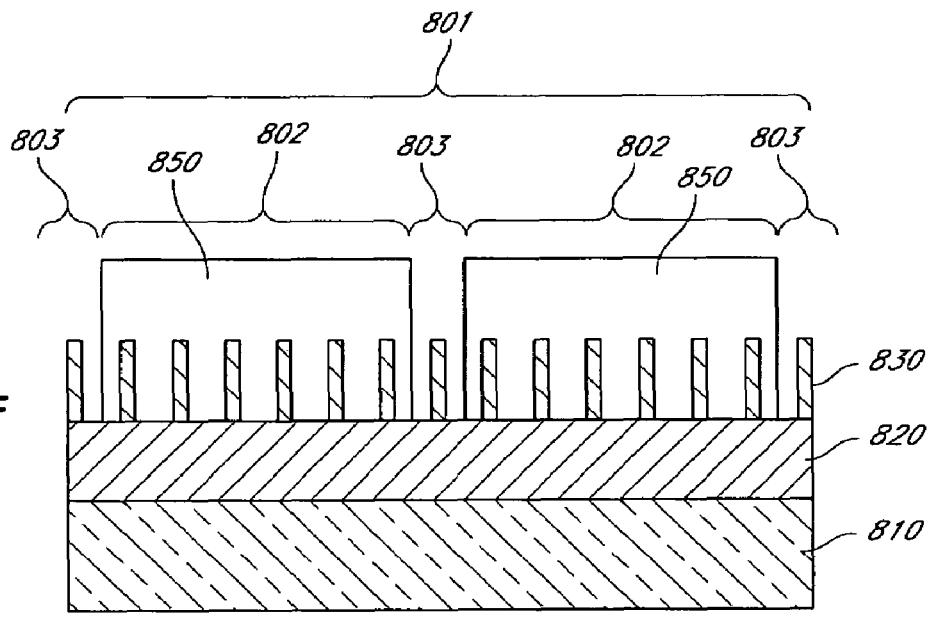

As shown in FIG. 8E, an additional blocking mask 850 is provided over the patterned hard mask layer 830. The mask 850 covers exposed surfaces, including the target layer 820 and the top and sidewalls of the hard mask layer 830. Then, the mask 850 is patterned to cover array regions 802 and to open the peripheral regions 803, as shown in FIG. 8F.

Figure 8G:
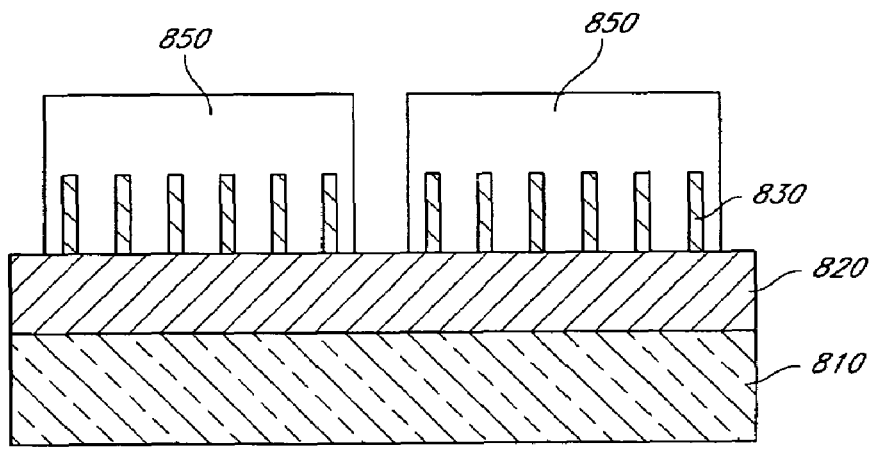
Figure 8H:
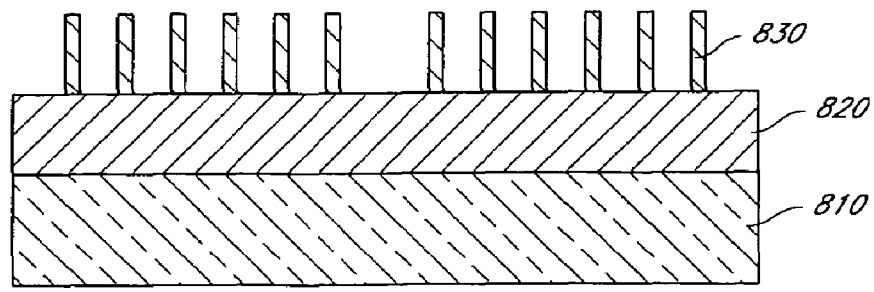

Subsequently, in FIG. 8G, the hard mask layer 830 in the peripheral regions 803 is etched through openings of the patterned mask layer 850. By this step, exposed features in the peripheral regions 803 are etched away, as shown in FIG. 8G. Subsequently, the mask layer 850 overlying the hard mask layer 830 is removed by any conventional method, as shown in FIG. 8H.

Figure 8I:
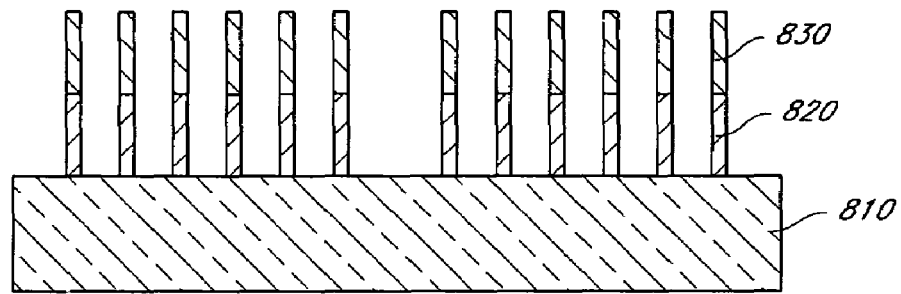
Figure 8J:
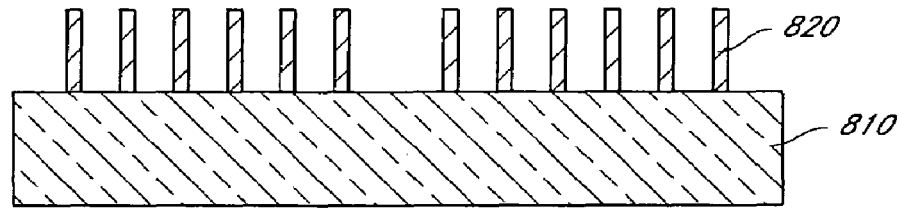

Next, a pattern in the hard mask layer 830 is transferred into the target layer 820, as shown in FIG. 8I. The pattern transfer can be performed using any suitable etch process selective for the target layer 820 relative to the hard mask layer 830. The etch process may be a dry etch process or a wet etch process. In the illustrated embodiment, an anisotropic plasma etch process is used for a faithful pattern transfer into the target layer 820. Subsequently, the hard mask layer 830 is removed by an etch process selective for the hard mask 830 relative to the target layer 820 and exposed underlying substrate 810, leaving behind arrays in the array regions 802. Although unpictured, after forming the arrays as described above, the substrate will be further provided with additional layers or materials to complete IC devices.

Additional Mask on Hard Mask in Damascene Process

FIGS. 9A-9H illustrate a method of forming a damascene structure using an additional blocking mask on a hard mask according to another embodiment. In the illustrated embodiment, a hard mask layer is provided with a repeating pattern of features in a first region. Then, an additional blocking mask is provided over the patterned hard mask to define array regions and peripheral regions in the first region.

Figure 9A:
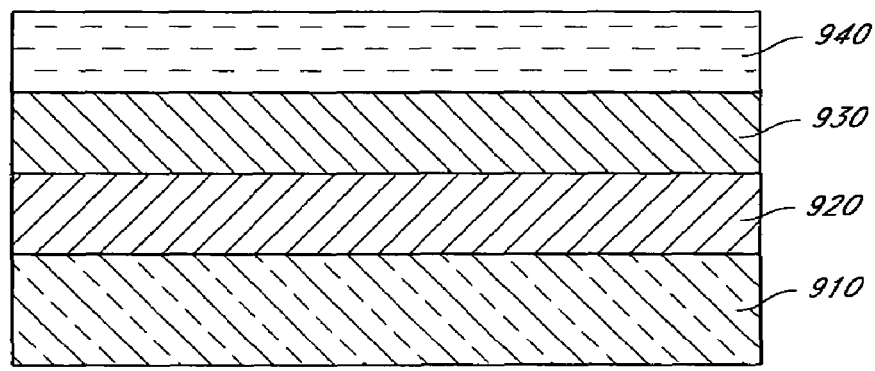
FIGS. 9A-9I are schematic cross-sections illustrating a damascene process for integrated circuit device arrays in accordance with another embodiment of the invention, in which repeating patterns are defined across several array regions but their transfers to a lower level is blocked in peripheral regions.

In FIG. 9A, a target layer 920 is provided over a substrate 910. The target layer is formed of a dielectric material, typically a form of silicon oxide. A hard mask layer 930 is provided over the target layer 920. A resist layer 940 is provided over the hard mask layer 930. The layers 910-940 may have similar thicknesses and materials as those described above with reference to FIGS. 8A-8J.

Figure 9B:
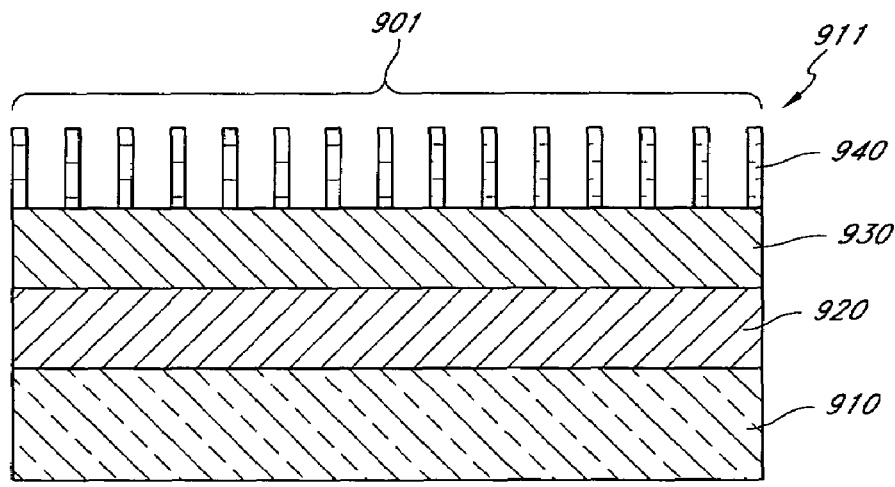

As shown in FIG. 9B, the resist layer 940 is patterned to provide a repeating pattern 911 of features to the hard mask layer 930. The pattern 911 includes substantially the same features throughout the first regions 901 in both array regions 902 and peripheral regions 903 (FIG. 9D) which will be later defined.

Figure 9C:
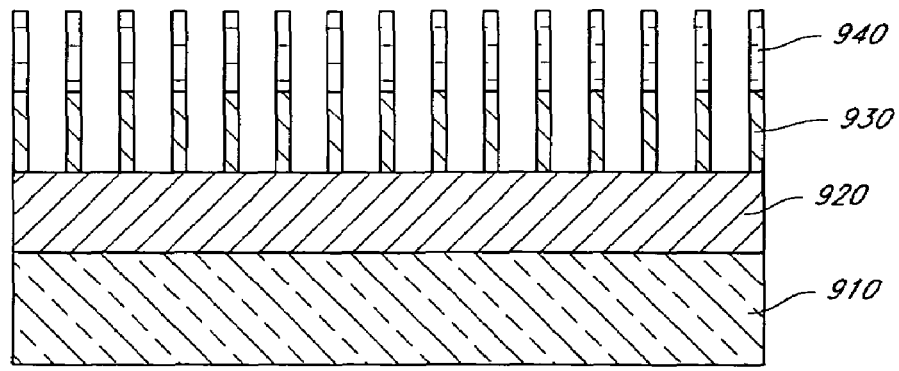
Figure 9D:
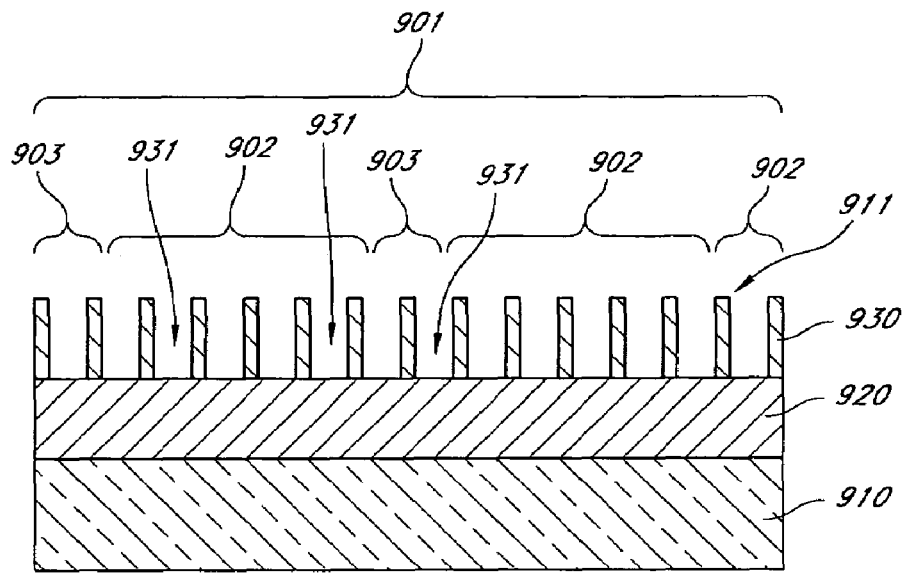

Subsequently, the hard mask layer 930 is etched through openings of the resist layer 940, as shown in FIG. 9C. Any suitable etchant can be used to selectively etch the hard mask layer 930 relative to the resist layer 940. Preferably, an anisotropic dry etch process is used. More preferably, a high-intensity plasma etch process is used for etching the hard mask layer 930. An additional hard mask layer (not shown) may be provided over the hard mask layer to provide excellent pattern transfer fidelity. The additional hard mask layer may be formed of a DARC. In addition or alternatively, a BARC layer (not shown) may be provided between the additional hard mask layer and the resist layer. After the etching step described above, the resist layer 940 is removed as shown in FIG. 9D.

Figure 9E:
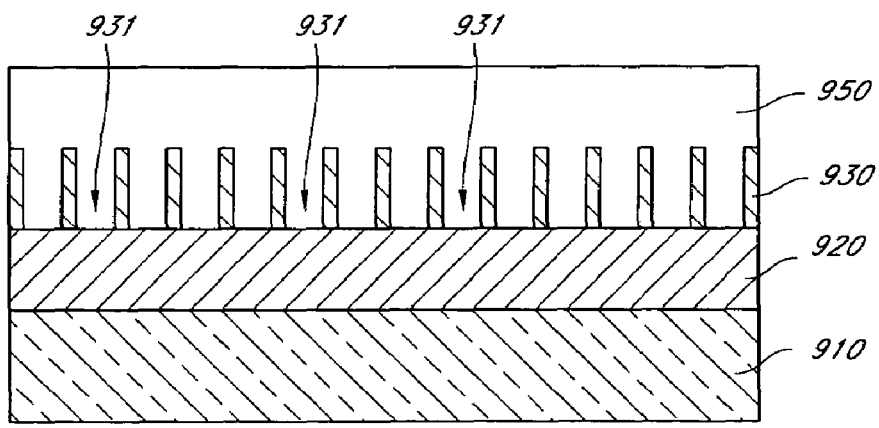

Next, as shown in FIG. 9E, a blocking mask 950 is provided over the patterned hard mask layer 930. The blocking mask 950 is preferably a soft mask formed of a resist, more preferably, a photoresist. A material for the resist is selected based on the lithographic process for patterning the resist. The blocking mask 950 fills spaces 931 in the hard mask layer 930 resulting from the etching step described above. In addition to filling the spaces 931, the blocking mask 950 covers top surfaces of the hard mask layer 930. Preferably, the blocking mask 950 has a thickness of between about 2,000 Å and about 11,000 Å, more preferably between 5,000 Å and about 7,000 Å.

Figure 9F:
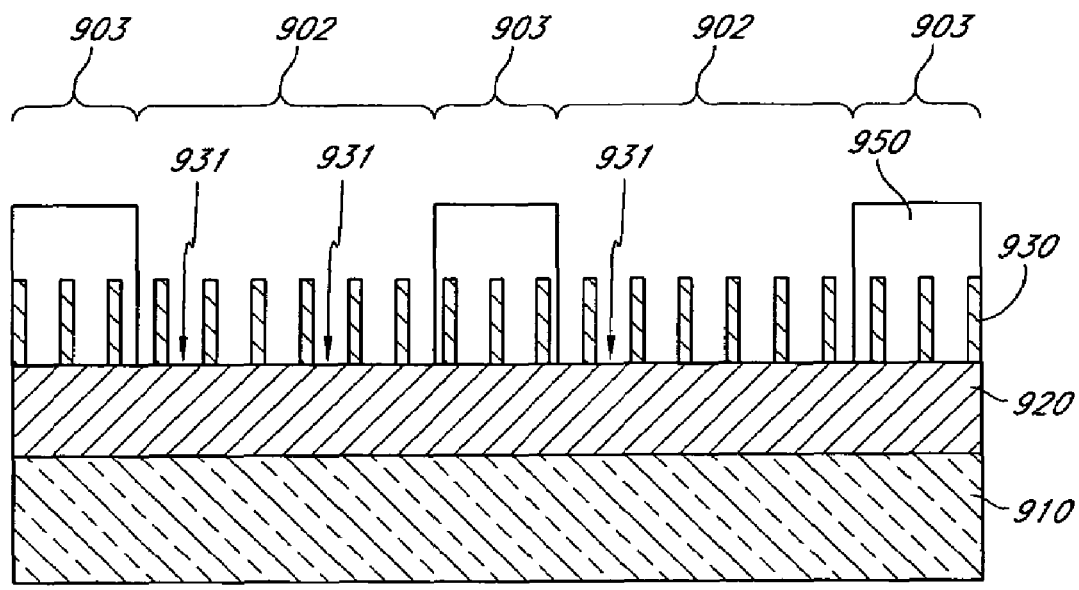

Subsequently, the blocking non-critical mask 950 is patterned to define the array regions 902 and peripheral regions 903. As shown in FIG. 9F, the mask layer 950 is patterned to expose the array regions 902 and cover the peripheral regions 903. The blocking mask 950 is patterned using a selected lithographic process. When patterning the blocking mask 940, the resist which has filled the spaces 931 is also removed to expose parts of the target layer surface as shown in FIG. 9F.

Figure 9G:
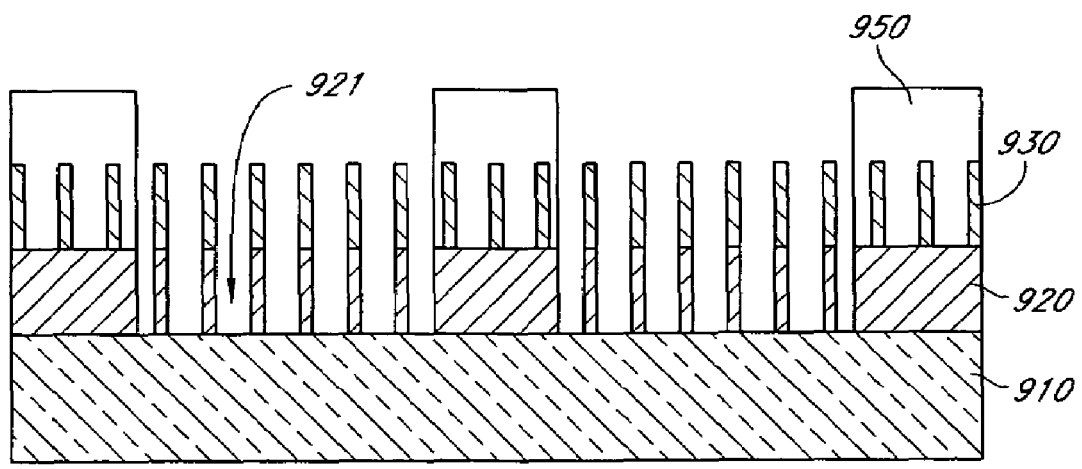
Figure 9H:
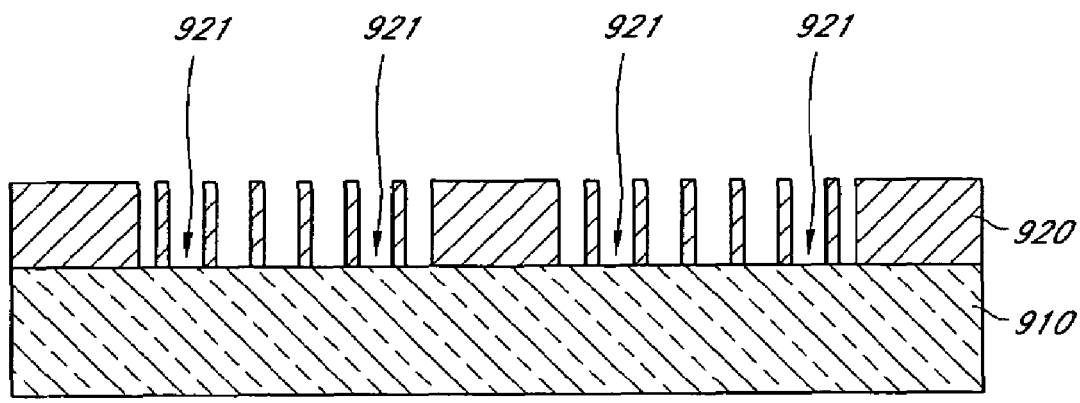
Figure 9I:
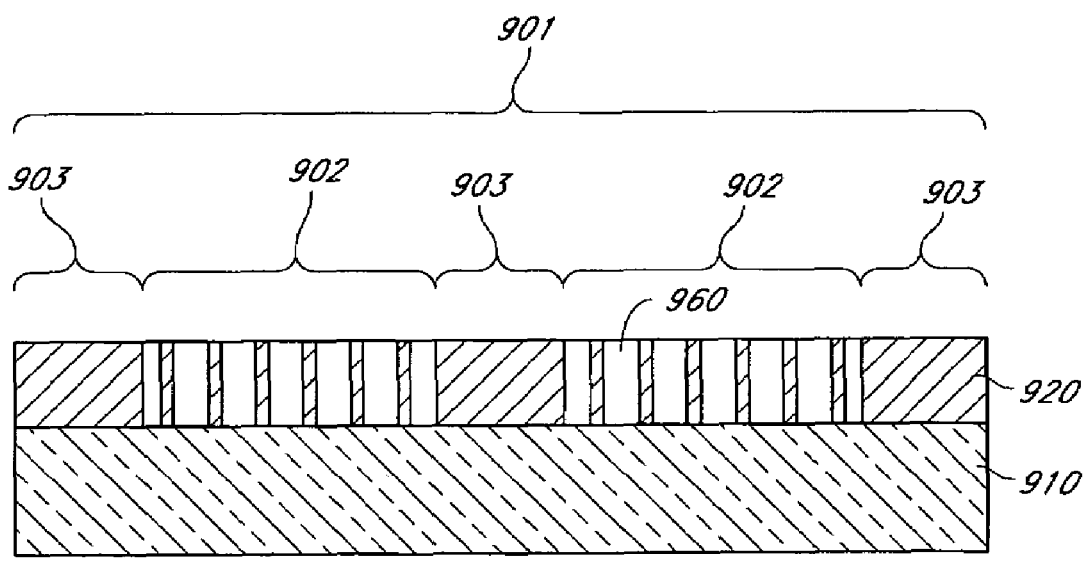

Next, as shown in FIG. 9G, the target layer 920 is etched through the hard mask layer 930. As a result, trenches 921 are formed in the array regions 902. Then, the hard mask layer 930 and the blocking mask 950 are removed as shown in FIG. 9H. Subsequently, a metal or its alloy is provided into the trenches 921. The metal may be one typically used to form an interconnect metal line. Examples of the metal include, but are not limited to, copper, silver, and gold. Subsequently, excess metal is polished to provide a planar surface on the top, as shown in FIG. 9I.

IC Array Devices

Another aspect of the invention provides an IC device having arrays made by the method described above. The method may be preferably used for fabricating IC device arrays having features which have a critical dimension of less than 100 nm, more preferably less than 60 nm and a line density of between about 5 lines/μm (100 nm nodes) and about 20 lines/μm (25 nm nodes).

A resulting IC device array preferably has optimal center-to-edge uniformity. In the context of this document, the center-to-edge uniformity is expressed in terms of center-to-edge deviation. The term "center-to-edge deviation," as used herein, refers to a measure of a degree of disparity in feature widths provided that features of the same width are transferred from a resist into center and edge portions of an IC array. The deviation is denoted as percentage of a difference of an edge feature width relative to a center feature width. For example, a center-to-edge deviation of 10% is obtained if features of the same width result in 100 nm-width in a center portion and 110 nm-width in an edge portion, or 100 nm-width in a center portion and 90 nm-width in an edge portion. Preferably, the resulting IC device array has a center-to-edge line width deviation of between about 0% and about 5%, more preferably between about 0% and about 1%.

Another aspect of the invention provides an electronic device including IC arrays made by the method described above. The electronic device may also include a system including a microprocessor and/or a memory device. Such a system may be a computer system, an electronic system, or an electromechanical system.

The electronic device may include, but is not limited to consumer electronic products, electronic circuits, electronic circuit components, parts of the consumer electronic products, electronic test equipments, etc. The consumer electronic products may include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device may include unfinished intermediate products.

In the embodiments described above, a pattern of features is formed across multiple arrays and intervening peripheries (and outer borders). Then, a pattern is removed from the peripheries (conventional patterning) or blocked from transfer to substrate (damascene) using a non-critical blocking mask which is inexpensive and easy to pattern. For pitch doubling embodiments, the blocking mask can also double in function to chop spacer loop ends (conventional patterning) or prevent spacer loop ends from transferring into substrate (damascene). The embodiments have advantage of pushing non-uniformities of arrays out to peripheral regions where they will be rendered nonoperative or removed by blocking mask.

Thus, according to one aspect, a method is provided for patterning integrated circuit (IC) device arrays. The method comprises forming a repeating pattern of features in a masking layer across a first region of a substrate. A blocking mask is applied over the features in the masking layer. The blocking mask differentiates array regions of the first region from peripheral regions of the first region. The pattern of features in the array regions is transferred into the substrate.

According to another aspect, a method is provided for forming memory device arrays. The method comprises forming a repeating pattern of features in a first layer across a first region of a substrate. A second layer is applied over the features in the first layer. The second layer is configured to cover a plurality of array regions within the first region and to open non-array regions within the first region outside the array regions, thereby exposing features in the non-array regions. The exposed features in the non-array regions of the first layer are removed while the second layer covers the plurality of array regions.

According to yet another aspect, a method is provided for forming a system. The method comprises forming a repeating pattern of features in a first layer across a first region of a substrate. A second layer is applied over the features in the first layer. The second layer is configured to open a plurality of active regions within the first region and to cover inactive regions within the first region outside the active regions, thereby exposing patterns of features in the plurality of active regions. The exposed patterns of features in the plurality of active regions of the first layer are transferred into a third layer underlying the first layer.

According to another aspect, an integrated circuit device is provided. The device comprises an array of lines having a line density of between about 5 lines/µm and about 20 lines/µm. The array has a center-to-edge line width deviation of between about 0% and about 5%.

According to yet another aspect, an intermediate integrated circuit structure is provided. The structure comprises a substrate comprising a plurality of array regions and peripheral regions surrounding and between the array regions. The structure also includes a first layer formed over the substrate. The first layer comprises a repeating pattern of features across both the array and peripheral regions.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

What is claimed is:

1. A method for patterning integrated circuit (IC) device arrays, comprising:
    forming a repeating pattern of features in a masking layer across a first region of a substrate, the first region including array regions and peripheral regions outside the array regions, the features having top and side surfaces, wherein the features are formed in the array regions and the peripheral regions,
    applying a blocking mask over the features in the masking layer, the blocking mask differentiating the array regions of the first region from the peripheral regions of the first region, the blocking mask covering substantially all of the top and side surfaces of a plurality of the features in the peripheral regions, wherein the applying comprises applying the blocking mask to the masking layer to then pattern to open a plurality of array regions within the first region, and to cover peripheral regions within the first region outside the array regions; and
    transferring the pattern of features in the array regions into the substrate.

2. The method of claim 1, wherein the IC device comprises a memory.

3. The method of claim 1, wherein the IC device comprises a microprocessor.

4. The method of claim 1, wherein the masking layer comprises a hard mask layer or a spacer layer.

5. The method of claim 1, wherein forming the repeating pattern of features comprises using photolithography.

6. The method of claim 1, wherein applying the blocking mask comprises using photolithography.

7. The method of claim 1, wherein transferring the pattern of features in the array region into the substrate comprises using an etch process.

8. The method of claim 7, wherein the etch process comprises using a dry etch.

9. The method of claim 7, wherein the etch process comprises using a plasma etch process.

10. The method of claim 7, wherein the etch process comprises an anisotropic etch process.

11. The method of claim 1, wherein forming the repeating pattern of features comprises forming a repeating pattern of pitch-multiplied spacers.

12. The method of claim 11, wherein forming the repeating pattern of pitch-multiplied spacers comprises:
    providing a hard mask layer overlying the substrate;
    forming a repeating pattern of features in the hard mask layer;
    forming spacers on sidewalls of the hard mask layer; and
    removing the hard mask layer, thereby forming the repeating pattern of the pitch-multiplied spacers.

13. The method of claim 12, wherein forming the spacers comprises:
    depositing a blanket layer of a spacer material on exposed surfaces of the hard mask layer and a layer underlying the hard mask layer; and
    removing spacer material from horizontal surfaces to leave vertically extending, free standing spacers.

14. The method of claim 1, wherein forming the repeating pattern of features comprises:
    providing a first hard mask layer overlying the substrate and a second hard mask layer overlying the first hard mask layer, the first hard mask layer being formed of a material different from that of the second hard mask layer; and
    patterning the second hard mask layer to have the repeating pattern of features.

15. The method of claim 14, wherein the first hard mask is formed of polysilicon, and wherein the second hard mask is formed of amorphous carbon.

16. The method of claim 1, wherein applying the blocking mask comprises:
    applying the blocking mask to the masking layer to cover a plurality of array regions within the first region and to open peripheral regions within the first region outside the array regions;

removing exposed features in the peripheral regions of the masking layer while the blocking mask covers the plurality of array regions; and removing the blocking mask after removing the features.

17. The method of claim 1, wherein transferring the pattern of features in the array regions into the substrate comprises: etching a layer underlying the masking layer through openings of the blocking mask and the masking layer in the array regions; and removing the blocking layer and the masking layer.

18. The method of claim 17, wherein the layer underlying the masking layer comprises a hard mask layer or the substrate.

19. The method of claim 1, further comprising: filling cavities in the substrate after transferring the pattern of features in the array regions into the substrate; and planarizing a top surface of the substrate.

20. A method for forming a system, comprising:
forming a repeating pattern of lines in a first layer across a first region of a substrate,
the first region including active regions and inactive regions outside the active regions, the lines having top and side surfaces, wherein the lines are formed in the active regions and the inactive regions;

applying a second layer over the features lines in the first layer, the second layer comprising a blocking mask layer that is patterned to open the active regions and to cover the inactive regions such that substantially all of the top and side surfaces of a plurality of the lines in the inactive regions are covered by the second aver, thereby exposing patterns of lines in the active regions; and transferring the exposed patterns of lines in the active regions of the first layer into a third layer underlying the first layer.

21. The method of claim 20, wherein the second layer comprises a blocking photoresist.

22. The method of claim 20, wherein the first layer comprises a hard mask layer.

23. The method of claim 22, wherein the hard mask layer comprises amorphous carbon.

24. The method of claim 20, wherein the first layer comprises a spacer layer.

25. The method of claim 24, wherein the spacer layer comprises silicon oxide.

* * * * *

UNITED STATES PATENT AND TRADEMARK OFFICE
CERTIFICATE OF CORRECTION

PATENT NO. : 7,488,685 B2
APPLICATION NO. : 11/411401
DATED : February 10, 2009
INVENTOR(S) : Kewley Page 1 of 1

It is certified that error appears in the above-identified patent and that said Letters Patent is hereby corrected as shown below:

In column 18, line 6, in Claim 20, delete "aver," and insert -- layer, --, therefor.

Signed and Sealed this

Twenty-first Day of April, 2009

JOHN DOLL
*Acting Director of the United States Patent and Trademark Office*